(12) United States Patent
Duggal et al.

(10) Patent No.: US 7,576,496 B2
(45) Date of Patent: *Aug. 18, 2009

(54) AC POWERED OLED DEVICE

(75) Inventors: Anil Raj Duggal, Niskayuna, NY (US); Joseph Darryl Michael, Schoharie, NY (US)

(73) Assignee: General Electric Company, Niskayuna, NY (US)

( * ) Notice: Subject to any disclaimer, the term of this patent is extended or adjusted under 35 U.S.C. 154(b) by 580 days.

This patent is subject to a terminal disclaimer.

(21) Appl. No.: 11/347,089

(22) Filed: Feb. 3, 2006

(65) Prior Publication Data

US 2006/0125410 A1    Jun. 15, 2006

Related U.S. Application Data

(63) Continuation-in-part of application No. 10/208,543, filed on Jul. 31, 2002, now abandoned, which is a continuation-in-part of application No. 09/712,474, filed on Nov. 14, 2000, now Pat. No. 6,800,999, which is a continuation-in-part of application No. 09/469,702, filed on Dec. 22, 1999, now Pat. No. 6,566,808.

(60) Provisional application No. 60/194,068, filed on Mar. 31, 2000, provisional application No. 60/178,451, filed on Jan. 27, 2000.

(51) Int. Cl.
*H05B 39/00* (2006.01)

(52) U.S. Cl. ................ 315/185 S; 315/185 R; 315/169; 313/504

(58) Field of Classification Search ... 315/169.1–169.3, 315/185 R, 185 S, 312, 318; 313/491, 495, 313/504–506, 509; 362/237, 800
See application file for complete search history.

(56) References Cited

U.S. PATENT DOCUMENTS

| | | |
|---|---|---|
| 3,763,468 A | 10/1973 | Ovshinsky et al. |
| 4,051,394 A | 9/1977 | Tieden |
| 4,186,020 A | 1/1980 | Wachtel |

(Continued)

FOREIGN PATENT DOCUMENTS

JP        11087055        3/1999

(Continued)

OTHER PUBLICATIONS

R. H. Friend, "Optical Investigations of Conjugated Polymers", Journal of Molecular Electronics, vol. 4, pp. 37-46, 1988.

(Continued)

*Primary Examiner*—Douglas W Owens
*Assistant Examiner*—Jimmy T Vu
(74) *Attorney, Agent, or Firm*—Mary Louise Gioeni

(57) ABSTRACT

AC powered light emitting device comprises a plurality of organic light emitting diode (OLED) modules. The OLED modules are arranged into a series group where the individual OLED modules are electrically connected in series. The device is configured to be coupled to an AC power supply. A display is also provided. The display includes a plurality of OLED modules arranged to depict a shape selected from the group consisting of at least one letter, at least one number, at least one image, and a combination thereof.

41 Claims, 23 Drawing Sheets

U.S. PATENT DOCUMENTS

| | | | |
|---|---|---|---|
| 4,190,788 A | 2/1980 | Yoshikawa et al. | |
| 4,535,271 A | 8/1985 | Holmes | |
| 4,913,946 A | 4/1990 | Sala et al. | |
| 5,247,190 A | 9/1993 | Friend et al. | 257/40 |
| 5,294,870 A | 3/1994 | Tang et al. | 313/504 |
| 5,463,280 A * | 10/1995 | Johnson | 315/187 |
| 5,607,227 A * | 3/1997 | Yasumoto et al. | 362/249.06 |
| 5,661,645 A | 8/1997 | Hochstein | |
| 5,705,285 A | 1/1998 | Shi et al. | 428/690 |
| 5,708,130 A | 1/1998 | Woo et al. | 328/397 |
| 5,828,181 A | 10/1998 | Okuda | |
| 5,874,803 A | 2/1999 | Garbuzov et al. | |
| 5,949,197 A | 9/1999 | Kastner | |
| 5,994,836 A | 11/1999 | DenBoer et al. | |
| 5,998,925 A | 12/1999 | Shimizu et al. | |
| 6,013,982 A | 1/2000 | Thompson et al. | |
| 6,072,280 A | 6/2000 | Allen | |
| 6,229,266 B1 | 5/2001 | Van Velzen et al. | |
| 6,245,393 B1 | 6/2001 | Thompson et al. | |
| 6,259,838 B1 | 7/2001 | Singh et al. | |
| 6,262,441 B1 | 7/2001 | Bohler et al. | |
| 6,337,492 B1 | 1/2002 | Jones et al. | |
| 6,370,019 B1 * | 4/2002 | Matthies et al. | 361/681 |
| 6,371,637 B1 * | 4/2002 | Atchinson et al. | 362/555 |
| 6,473,064 B1 | 10/2002 | Tsuchida et al. | |
| 6,566,808 B1 | 5/2003 | Duggal et al. | |
| 6,566,824 B2 | 5/2003 | Panagotacos et al. | |
| 6,800,999 B1 * | 10/2004 | Duggal et al. | 315/169.1 |
| 7,049,757 B2 * | 5/2006 | Foust et al. | 315/185 S |

FOREIGN PATENT DOCUMENTS

WO    WO 97/38347    10/1997

OTHER PUBLICATIONS

Gerrit Klärner et al., "Colorfast Blue-Light-Emitting Random Copolymers Derived From Di-*n*-hexylfluorene and Anthracene", Advanced Materials, Communications, vol. 10, No. 13, pp. 993-997, 1998.

Junji Kido et al, "Organic Electroluminescent Devices Based on Molecularly Doped Polymers", Applied Physics Letters, vol. 61, No. 7, pp. 761-763, Aug. 17, 1992.

Chung-Chih Wu et al., "Efficient Organic Electroluminescent Devices Using Single-Layer Doped Polymer Thin Films With Bipolar Carrier Transport Abilities", IEEE Transactions on Electron Devices, vol. 44, No. 8, pp. 1269-1280, 1997.

A. W. Grice et al., "High Brightness and Efficiency Blue Light-Emitting Polymer Diodes", Applied Physics Letters, vol. 73, No. 5, pp. 629-631, Aug. 3, 1998.

Hiroyuki Suzuki et al., "Near-Ultraviolet Electroluminescence From Polysilanes", Thin Solid Films, vol. 331, pp. 64-70, 1998.

* cited by examiner

AC POWERED OLED DEVICE

RELATED APPLICATION

This application is a continuation-in-part of U.S. application Ser. No. 10/208,543, filed on Jul. 31, 2002, now abandoned which is a continuation-in-part of U.S. application Ser. No. 09/712,474, filed Nov. 14, 2000 now U.S. Pat. No. 6,800,999, which is a continuation-in-part of U.S. application Ser. No. 09/469,702 filed Dec. 22, 1999 now U.S. Pat. No. 6,566,808. This application, as do U.S. application Ser. No. 10/208,543, U.S. application Ser. No. 09/712,474, and U.S. application Ser. No. 09/469,702, claims the benefit of U.S. Provisional Application No. 60/194,068, filed Mar. 31, 2000, and of U.S. Provisional Application No. 60/178,451, filed Jan. 27, 2000, the disclosures of which are hereby incorporated by reference in their entirety.

BACKGROUND OF THE INVENTION

The present invention relates generally to AC powered light devices, and more particularly to an AC powered organic light emitting diode (OLED) device.

Organic electroluminescent devices, such as organic light emitting diodes (OLEDs), are currently used for display applications and are planned for use in general lighting applications. An OLED device includes one or more light emitting layers disposed between two electrodes, e.g., a cathode and a light transmissive anode, formed on a light transmissive substrate. The light emitting layer emits light upon application of a voltage across the anode and cathode. Upon the application of a voltage from a voltage source, electrons are directly injected into the organic layer from the cathode, and holes are directly injected into the organic layer from the anode. The electrons and the holes travel through the organic layer until they recombine at a luminescent center. This recombination process results in the emission of a photon, i.e., light.

Large area OLED devices typically combine many individual OLED devices on a single substrate or a combination of substrates with multiple individual OLED devices on each substrate. Applications for large area OLED devices include lighting. For most of these applications, alternating current (AC) power is most readily available. However, OLEDs have rectifying current/voltage characteristics and so are typically operated with direct current (DC) power wired with the correct polarity for light emission. In these applications, AC power is converted to DC power to operate the large area OLEDs.

In many signage applications, the sign or display system comprises a light source, and a covering sheet overlying the light source to define the image or lettering desired. The covering sheet is partly opaque and partly transparent. Light from the light source is transmitted through the transparent regions of the covering sheet but not through the opaque regions. Thus, typically, a covering sheet is required to define the image or lettering desired.

BRIEF SUMMARY OF THE INVENTION

It would be an advantage to provide an OLED system, such as a large area OLED, where the individual OLED devices of an array of OLED devices could be powered directly by AC power. Such a system does not require AC to DC power conversion and conditioning, and thus lowers the cost for the OLED system.

It would also be an advantage to provide an OLED system, such as a large area OLED, that did not require a covering sheet to define an image or lettering, and that required only a number of individual OLED devices to define the image or lettering.

In accordance with one aspect of the present invention, there is provided a light emitting device comprising at least one OLED module, and an AC power source electrically connected to and providing an AC voltage to the at least one OLED module.

In accordance with another aspect of the present invention, there is provided a light emitting device comprising a plurality of organic light emitting diode (OLED) modules electrically connected in series, and an alternating current (AC) power source electrically connected to and providing an AC voltage to the plurality of OLED modules.

In accordance with another aspect of the present invention, there is provided a method of operating the light emitting devices described above, the method comprising providing an AC square waveform voltage to the first and second conducting layers.

In accordance with another aspect of the present invention, there is provided a method of making a light emitting device comprising providing a substrate, forming a plurality of OLED series groups on the substrate, each OLED series group comprising a plurality of OLED modules, the OLED modules of each OLED series group electrically connected in series, wherein the OLED modules are configured to emit light upon application of the AC voltage.

In accordance with another aspect of the present invention, there is provided a method of making a light emitting device comprising providing a substrate, forming a first conducting material over the substrate, forming an light emitting material over at least part of the first electrode material, forming a second conducting material over at least part of the light emitting material, and patterning the first conducting material, light emitting material, and second conducting material to form a plurality of organic light emitting diode (OLED) modules, each OLED module having a first electrode formed from the patterned first conducting material, a light emitting layer formed from the light emitting material, and a second electrode formed from the patterned second conducting material, the first and second electrodes of respective OLED modules electrically connected to electrically connect the OLED modules in series.

In accordance with another aspect of the present invention, there is provided a display comprising a plurality of OLED modules arranged to spell out a letter or depict an image.

In accordance with another aspect of the present invention, there is provided a method of making a display comprising providing a substrate, and arranging a plurality of OLED modules to spell out a letter or depict an image.

BRIEF DESCRIPTION OF THE DRAWINGS

Other features and advantages of the invention will be apparent from the following detailed description of the embodiments and the accompanying drawings, in which.

DETAILED DESCRIPTION

Figure 1:
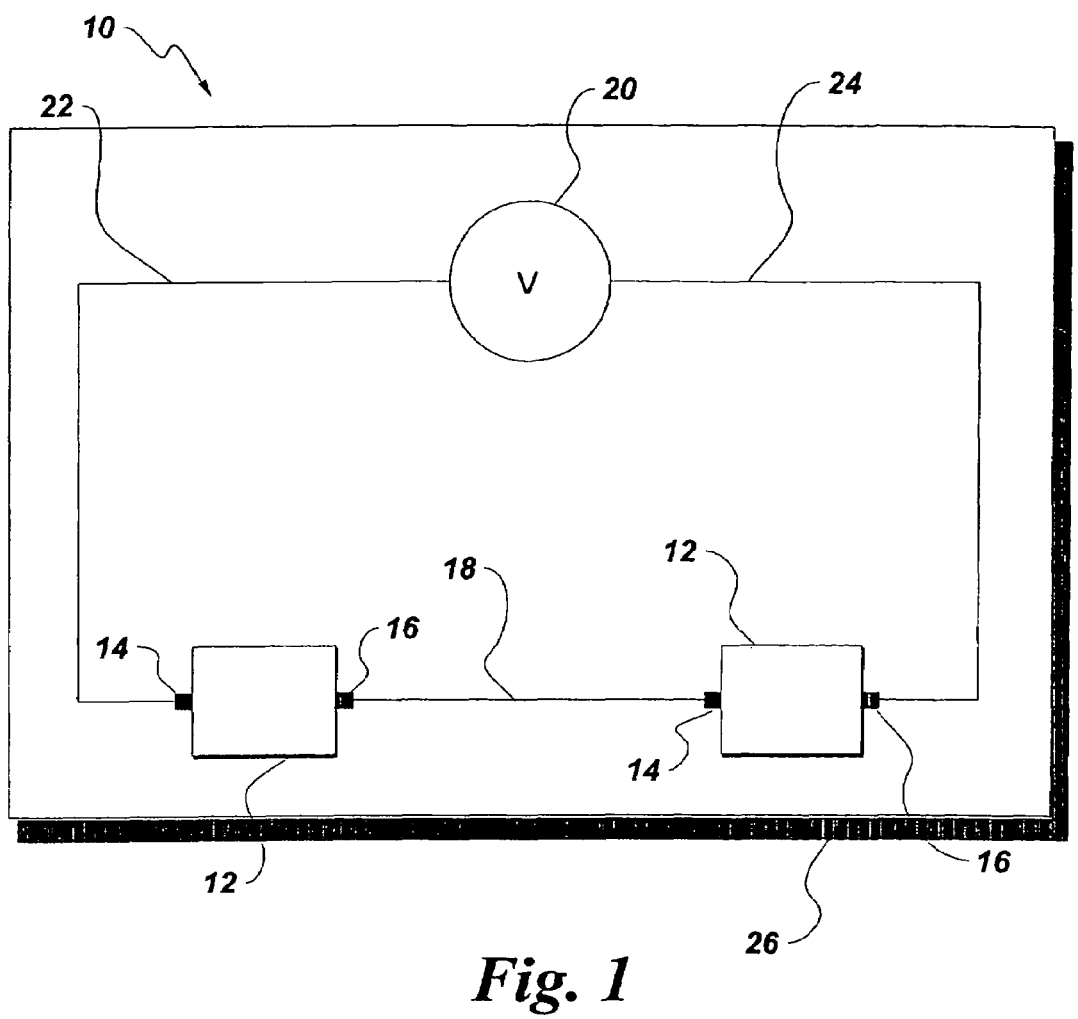
FIG. 1 is a drawing of a light emitting device according to a first embodiment of the invention.

FIG. 1 illustrates a light emitting device according to a first embodiment of the present invention. The light emitting device 10 of FIG. 1 includes a plurality of OLED modules 12. FIG. 1 illustrates two OLED modules 12. In one embodiment of the present invention, the number of OLED modules is greater than two. The OLED modules 12 are arranged such that they are connected in series with one another.

Each of the individual OLED modules 12 has an anode 14 and a cathode 16. The OLED modules 12 are electrically connected in a series arrangement, anode 14 to cathode 16, as shown in FIG. 1. In this regard, the respective anodes and cathodes are typically electrically connected via interconnect wiring 18 as shown in FIG. 1.

The light emitting device 10 also includes an AC power source 20 to provide an AC voltage to the OLED modules 12. The AC power source 20 provides power to the plurality of OLED modules 12 via first conducting line 22 and second conducting line 24. The conducting lines 22 and 24, are electrically connected to a respective end anode 14 and respective end cathode 16 of the plurality of OLED modules 12.

In one embodiment of the present invention, at least two OLED modules 12 are connected in series. The OLED modules 12 on each end of the series are electrically connected to only one other OLED module 12. In this case, the conducting lines 22 and 24 are respectively connected with the anode 14 and cathode 16 of the respective OLED modules disposed on the ends of the series. Thus, the AC power source 20 provides an AC voltage to each of the OLED modules 12 of the plurality of OLED modules 12.

The AC power source 20 and the plurality of OLED modules 12 are shown in FIG. 1 as arranged on a substrate 26. However, the plurality of OLED modules 12 and the AC power source 20 need not be arranged on a single substrate. In fact, neither the plurality of OLED modules 12 nor the AC power source 20 need be arranged on a substrate.

FIG. 1 shows a light emitting device 10 with only a single group of OLED modules 12 arranged in a series configuration. However, the first embodiment of the present invention is not so limited. In one embodiment of the present invention, the light emitting device 10 of the first embodiment comprises more than one group of OLED modules 12, and the OLED modules 12 of each group is arranged in a series configuration. In this case, the groups are electrically connected with each other in a parallel configuration.

Figure 2:
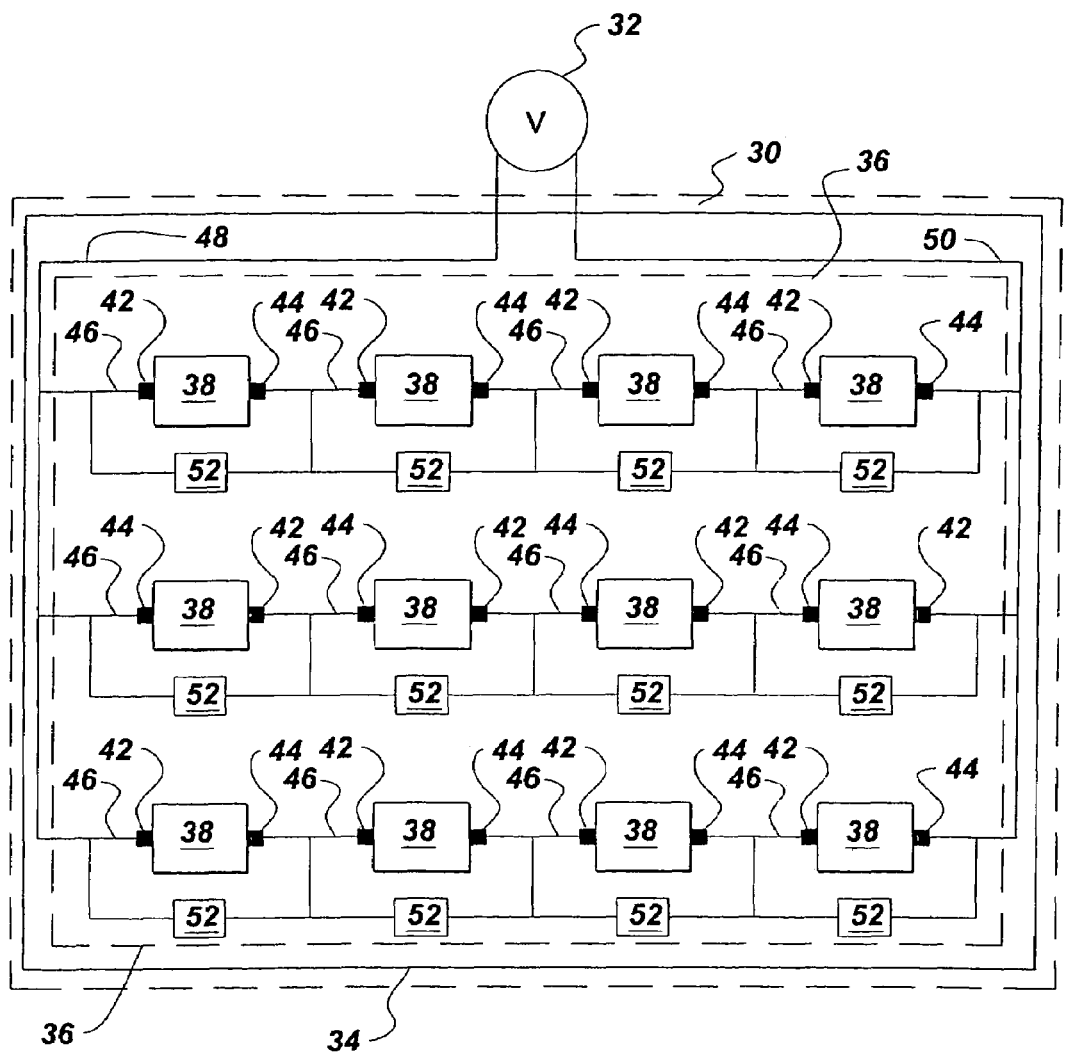
FIG. 2 is a drawing of a light emitting device according to a second embodiment of the invention.

FIG. 2 illustrates a second embodiment of the present invention. A light emitting device 30 of the second embodiment is seen connected to an AC power source 32. The light emitting device 30 includes a substrate 34 and a plurality of OLED series groups 36 provided on the substrate 34. In one embodiment of the present invention, the substrate 34 is comprises a transparent glass.

Each of the OLED series groups 36 comprises a plurality of individual OLED modules 38. When an AC voltage is provided from the AC power source 32 to the OLED modules 38, the OLED modules 38 emit light.

As with the first embodiment, each of the OLED modules 38 in the second embodiment includes the anode 42 and the cathode 44. The OLED modules 38 of a particular series group are electrically connected in series, i.e., an anode 42 of one OLED module 38 to a cathode 44 of an adjacent OLED module 38.

FIG. 2 shows that adjacent OLED modules 38 in a particular series group 36 are connected anode 42 to cathode 44. However, it is not required that adjacent OLED modules 38 in a particular series group 36 be so connected. In one embodiment of the present invention, a particular OLED module 38 in a series group 36 is connected to another OLED module 38, where that other OLED module 38 is not immediately adjacent or the closest OLED module 38 to the particular OLED module 38. However, in any case, all the OLED modules 38 in a particular series group are electrically connected in series.

As with the first embodiment, in the second embodiment the respective anodes 42 and cathodes 44 of the OLED modules 38 electrically connected in series are typically connected via interconnect wiring 46.

AC power is provided to the series groups 36 and thus the individual OLED modules 38 from the AC power source 32 via a first conducting line 48 and a second conducting line 50. The first conducting line 48 is electrically connected to a first end of each OLED series group 36. The second conducting line 50 is electrically connected to a second end of each OLED series group 36 opposite the first end. The first end and second end of each OLED series group 36 are opposite to each other in the sense of having opposite polarity, i.e., one of the ends is electrically connected to the cathode 44 and the other end is electrically connected to an anode 42. The first end and second end need not be opposite to each other in a spatial sense, i.e., the first end and second end need not correspond to the OLED modules 38 that are physically the furthest apart.

FIG. 2 shows the AC power source 32 as being separate from the light emitting device 30. In another embodiment of the present invention, the AC power source 32 is included in the light emitting device 30.

In another embodiment of the present invention, the light emitting device 30 further comprises a plurality of circuit elements 52. Each circuit element 52 is electrically connected in parallel with a respective OLED module 38. In this case, each OLED module 38 does not have a corresponding circuit element 52. However, if the light emitting device 30 includes circuit elements 52, at least some of the OLED modules 38 have a corresponding circuit element 52.

FIG. 2 shows each of the circuit elements 52 in parallel with a single OLED module 38. In another embodiment of the present invention, a particular circuit element 52 is in parallel with more than one OLED module 38.

In another embodiment of the present invention, the circuit elements 52 arte selected from the group consisting of resistors, diodes, varistors, and combinations thereof. The circuit element 52 functions to modify the voltage across its respective OLED module 38. In another embodiment of the present invention, the circuit element 52 reduces the voltage across its respective OLED module 38 to provide a proper operating voltage for the OLED module 38.

In another embodiment of the present invention, the circuit element 52 functions to provide fault tolerance for its respective OLED module 38. The circuit element 52 is selected from the group consisting of a diode, a varistor, a resistor, and any combination thereof.

In another embodiment of the present invention, the series groups 36 of the light emitting device 30 is arranged such that the ends of the series groups 36 that are connected to the first conducting line 48 have alternating polarity as shown in FIG. 2. In this embodiment, the first conducting line 48 is electrically connected to one series group via the cathode 44 of the OLED module 38 of that series group 36, and the next series group 36 is electrically connected to the first conducting line 48 via an anode 42 of the OLED module 38 of that next series group 36. Likewise, the second conducting line 50 is connected to the end of the series group 36 having alternating polarity.

When AC power is provided to the light emitting device 30, and the series groups 36 are arranged to be connected with alternating polarity, the fraction of the series groups 36 connected with one polarity emits light during one half-cycle of the AC waveform. During the other half-cycle, the remaining series groups 36 connected with the opposite polarity emits light. Thus, the light emitted during both half-cycles of the AC waveform has temporal uniformity.

If it is desired that the light emitted during both half cycles be of the same overall intensity, then one-half of the OLED modules 38 of the series groups 36 are connected with one polarity and one-half with the other polarity. Of course, if an application does not require that the light emitted during alternating half-cycles have a uniform temporal intensity, then the fraction of OLED modules connected with one polarity need not be the same as the fraction connected with the opposite polarity. In another embodiment of the present invention, the OLED modules 38 are connected with the same polarity as shown in FIG. 5.

FIG. 2 illustrates an embodiment of the present invention where the series groups 36 that are immediately adjacent to one another are connected to have opposite polarity. The light emitting device in this arrangement emits light with a uniform spatial intensity. In another embodiment of the present invention, the series groups 36 are be arranged such that immediately adjacent series groups have the same polarity.

FIG. 2 illustrates each of the series groups 36 comprising a row of OLED modules 38 where the OLED modules in the group are arranged in a straight line. In another embodiment of the present invention, the series groups 36 comprise a group of OLED modules 38 arranged in a configuration other than a straight line. In this embodiment, the group of OLED modules 38 corresponding to a particular series groups 36 are arranged in more than one straight line of OLED modules 38. In another embodiment of the present invention (not shown in FIG. 2), the group of OLED modules 38 corresponding to a particular series groups 36 are arranged so that only a fraction of the OLED modules 38 are in one particular line.

FIG. 2 illustrates each of the series groups 36 having four OLED modules 38. However, the number of OLED modules 38 is not limited to four, and the actual number of OLED modules 38 are left to the artisan to determine. The number of OLED modules 38 will depend upon the maximum desired voltage for an OLED module 38, and upon the maximum voltage provided by the AC power source 32 at the peak of the AC voltage waveform used in operation. For example, when a 120V AC source 32 is employed and each OLED module 38 has an identical current/voltage characteristic with a maximum desired voltage of 10V, then twelve OLED modules 38 are connected in series. Alternatively, if circuit elements 52 are employed to reduce the voltage to respective OLED modules 38 by one-third, eight OLED modules 38 are employed in each series group 36. In this case, the circuit elements 52 are disposed in series with the OLED modules 38. The details of the circuit elements 52 are as discussed above.

Figure 3:
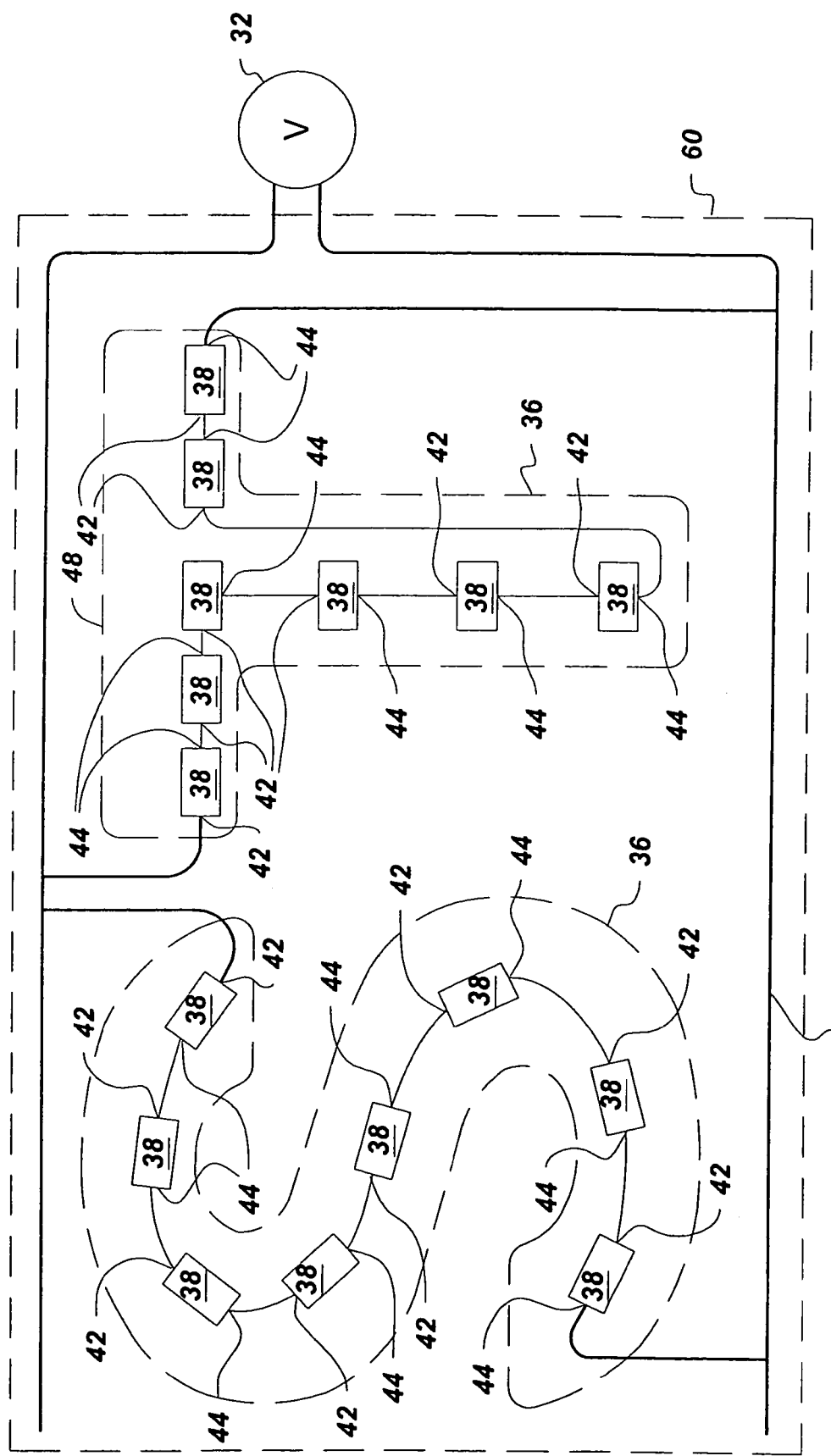
FIG. 3 is a drawing of a light emitting device according to another embodiment of the invention.

FIG. 3 illustrates an embodiment of the invention where the OLED modules 38 of a particular series group 36 of a light emitting device 60 are arranged as part of a sign to spell out a word or depict an image. As with the second embodiment, in the embodiment of FIG. 3, the light emitting device 60 comprises the plurality of series groups 36, each series group 36 comprising the plurality of OLED modules 38. Also, as with the second embodiment, in the embodiment of FIG. 3, the OLED modules 38, each having an anode 42 and cathode 44, of a particular series group are electrically connected in series, i.e., anode 42 to cathode 44. When an AC voltage is provided from the AC power source 32 to the OLED modules 38, the OLED modules 38 emit light.

Figure 4:
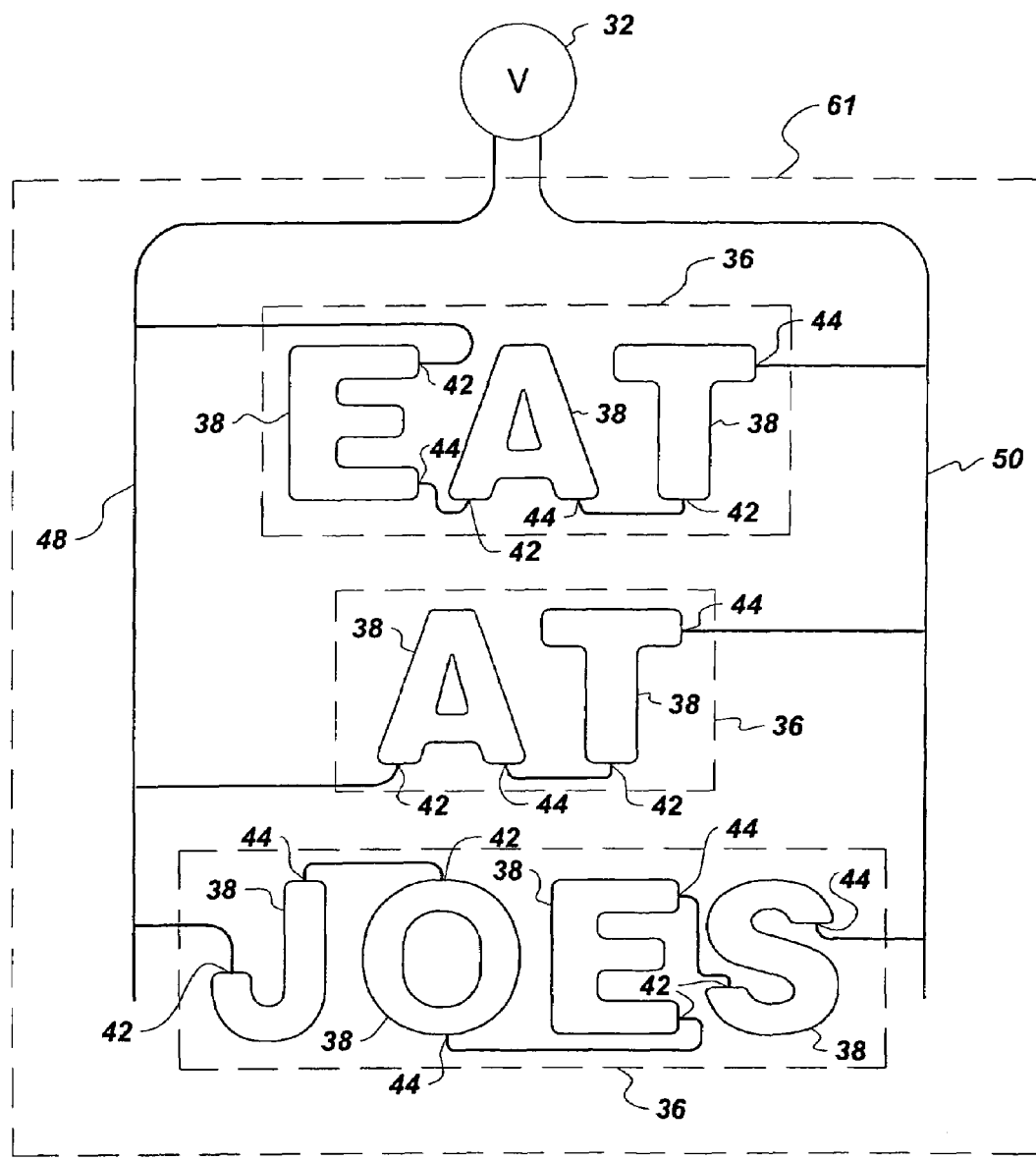
FIG. 4 is a drawing of a light emitting device according to another embodiment of the invention.

As used herein, the light emitting device 60 of FIG. 3 and 61 of FIG. 4 also refers to a display 60 where at least one OLED module 38 is disposed to depict at least one of the group consisting of letters, numbers, images, and any combination thereof.

AC power is provided to the series groups 36 and thus the individual OLED modules 38 are coupled to the AC power source 32 (either separate from or part of the light emitting device 60). The AC power is provided via first conducting line 48 and second conducting line 50. The first conducting line 48 is electrically connected to a first end of each OLED series group 36. The second conducting line 50 is electrically connected to a second end of each OLED series group 36 opposite the first end.

The OLED modules 38 collectively spell out the letters "S" and "T" in FIG. 3. It is left to the artisan to determine how the OLED modules 38 are arranged to spell out any text, present any numbers, or depict any images. In one embodiment of the present invention, individual letters, numbers or images are presented using more than one series group 36 and in a more specific embodiment of the present invention individual letters, numbers, or images are presented in all a single series group 36. In another embodiment of the present invention, individual letters, numbers, or images are presented using a part of a single series group 36.

FIG. 3 illustrates the OLED modules 38 arranged to spell out letters or depict images where the OLED modules 38 are arranged in a series group 36 of connected OLED modules 38. Alternatively, in another embodiment (not shown in FIG. 3), the OLED modules 38 are arranged in parallel with respect to each other.

The embodiment of FIG. 3, whether powered by a DC power source or an AC power source, provides an advantage over display or sign systems that comprise a light source and a covering sheet to block some of the light from the source to depict an image. In the embodiment of FIG. 3, no covering sheet is required. Furthermore, the system of FIG. 3 need include only the number of OLED modules 38 necessary to depict an image, number or image, and not a full array. Thus, a cost saving is potentially achieved.

FIG. 4 shows another embodiment of the invention similar to that of FIG. 3. However, in the embodiment of FIG. 4, a single OLED module 38 is shaped like a letter, number, or a desired image as determined by the artisan. As with the embodiment of FIG. 3, a light emitting device 61 of the embodiment of FIG. 4 comprises the plurality of series groups 36, each series group comprising the plurality of OLED modules 38. However, in the embodiment of FIG. 4, each of the OLED modules 38 is shaped like a letter, number, or image. In the embodiment of FIG. 4, the OLED modules 38, each having an anode 42 and cathode 44, of a particular series group 36 are electrically connected in series, i.e., anode 42 to cathode 44. When an AC voltage is provided from the AC power source 32 to the OLED modules 38, the OLED modules 38 emit light.

AC power is provided to the series groups 36 and thus the individual OLED modules 38 from the AC power source 32 (either separate from or part of the light emitting device). The AC power is provided via the first conducting line 48 and the second conducting line 50. The first conducting line 48 is electrically connected to the first end of each OLED series group 36. The second conducting line 50 is electrically connected to the second end of each OLED series group 36 opposite the first end.

The three OLED series groups in FIG. 4, respectively spell out the words "EAT", "AT", and "JOES". The artisan is left to determine how to arrange the OLED modules to depict any letters, number, and images desired.

FIG. 4 illustrates the OLED modules 38 arranged to depict letters, numbers, and images where the OLED modules 38 are arranged in series group 36 of connected OLED modules 38. In another embodiment of the present invention, the OLED modules 38 are connected in parallel with each other.

Figure 5A:
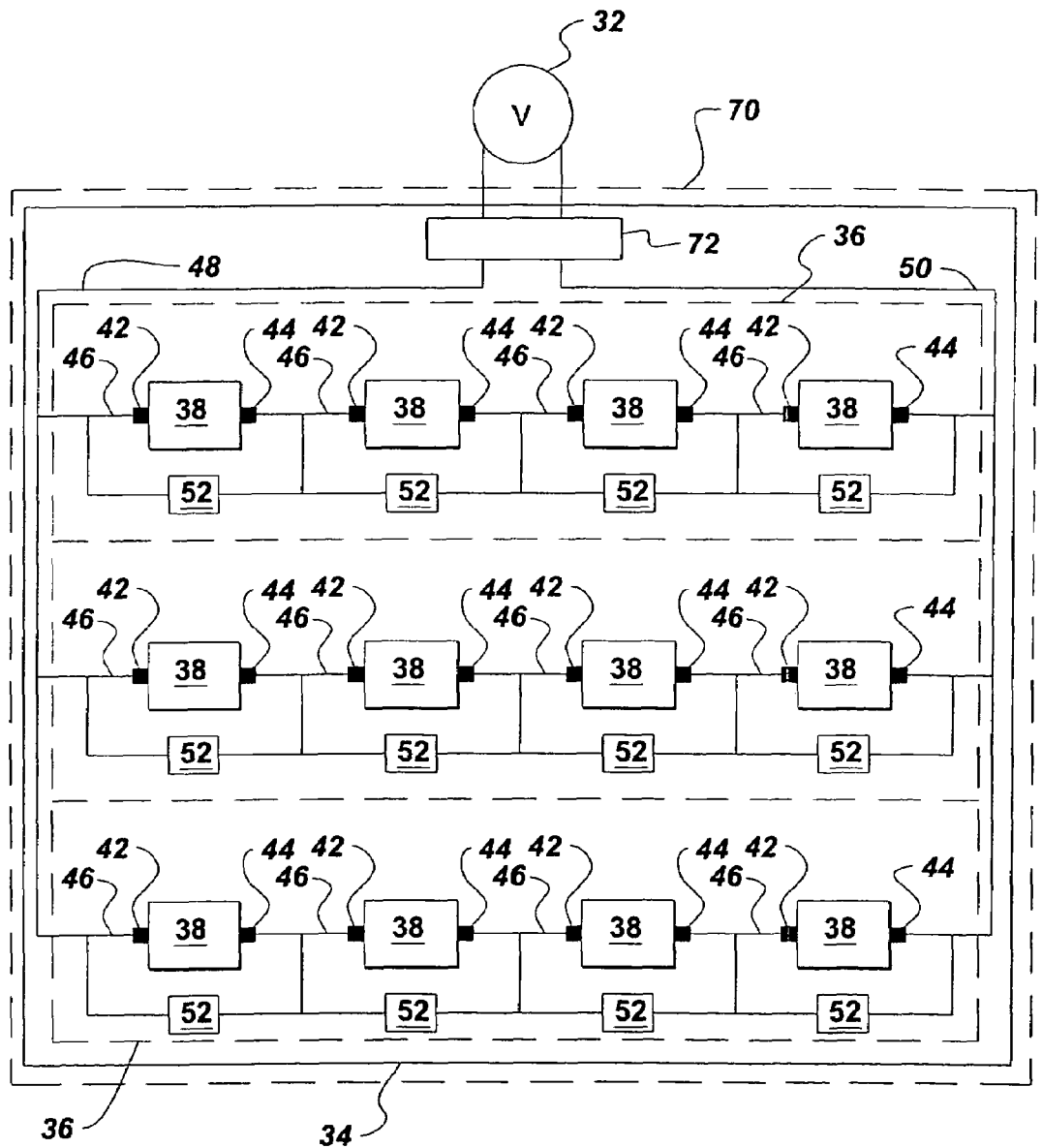
FIG. 5A is a drawing of a light emitting device according to another embodiment of the invention.
Figure 5B:
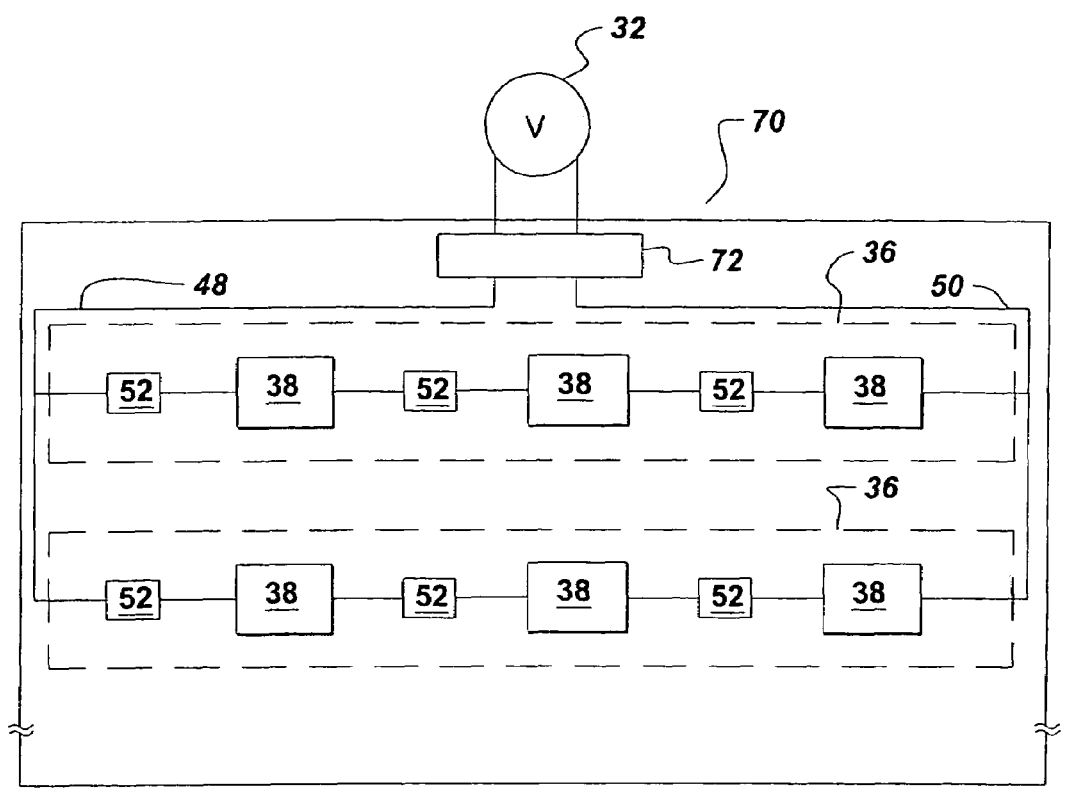
FIG. 5B is a drawing of a light emitting device according to another embodiment of the invention.

FIGS. 5A and 5B illustrate additional embodiments of the invention. The embodiment of FIG. 5A is the same as that of the second embodiment (FIG. 2), except that a light emitting device 70 of FIG. 5A includes the converting circuit 72. The middle series group 36 as depicted in FIG. 5A is connected between the first conducting line 48 and the second conducting line 50 in the same polarity configuration compared to the top and bottom series groups 36. The other portions of the description of the embodiment of FIG. 5A are the same as that of the second embodiment (FIG. 2), and are omitted here for the sake of brevity.

Figure 6:
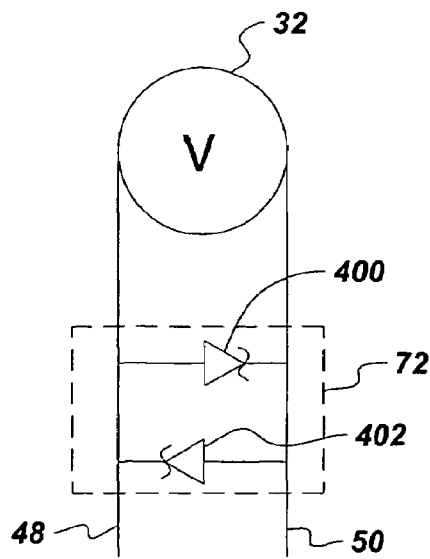
FIG. 6 is a drawing including a converting circuit for use with the embodiment of FIGS. 5A and 5B.

The converting circuit 72 is connected to both the AC power source 32, and the first conducting line 48 and second conducting line 50. The converting circuit 72 acts to convert the voltage waveform applied by the AC power source 32 to a converted voltage waveform. The converted voltage waveform is then applied to the series group modules 36. An example of the converting circuit 72, as shown in FIG. 6, is described below.

Figure 9:
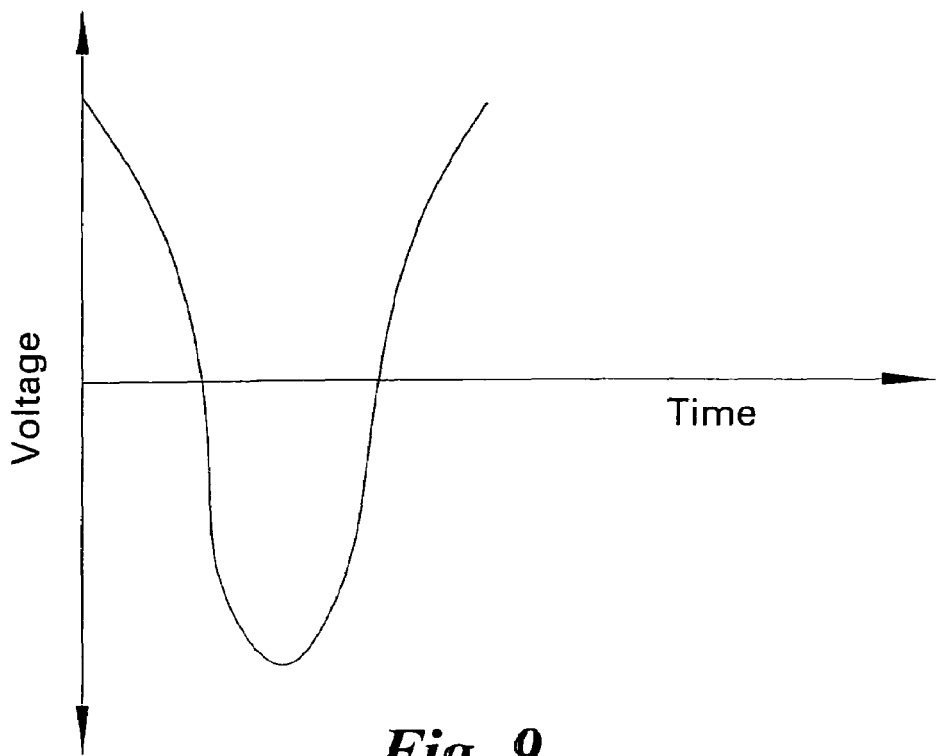
FIGS. 9 and 10 illustrate a sinusoidal voltage waveform output from an AC power source, and a square pulse waveform, respectively.

FIG. 9 shows a sinusoidal voltage waveform output from an AC power source, such as a line voltage. In applications where a square pulse waveform is desired, the converting circuit acts to convert the sinusoidal voltage waveform to a square pulse waveform, such as the one shown in FIG. 10. In one embodiment of the present invention, a square pulse waveform is utilized for applications where the OLED modules 38 operate at their highest efficiency at a particular voltage. The voltage magnitude of the square pulse is set to be at about the highest efficiency voltage in that case. Thus, the converting circuit 72 acts to provide a converted waveform so that the optimum voltage is applied across the OLED modules.

Figure 10:
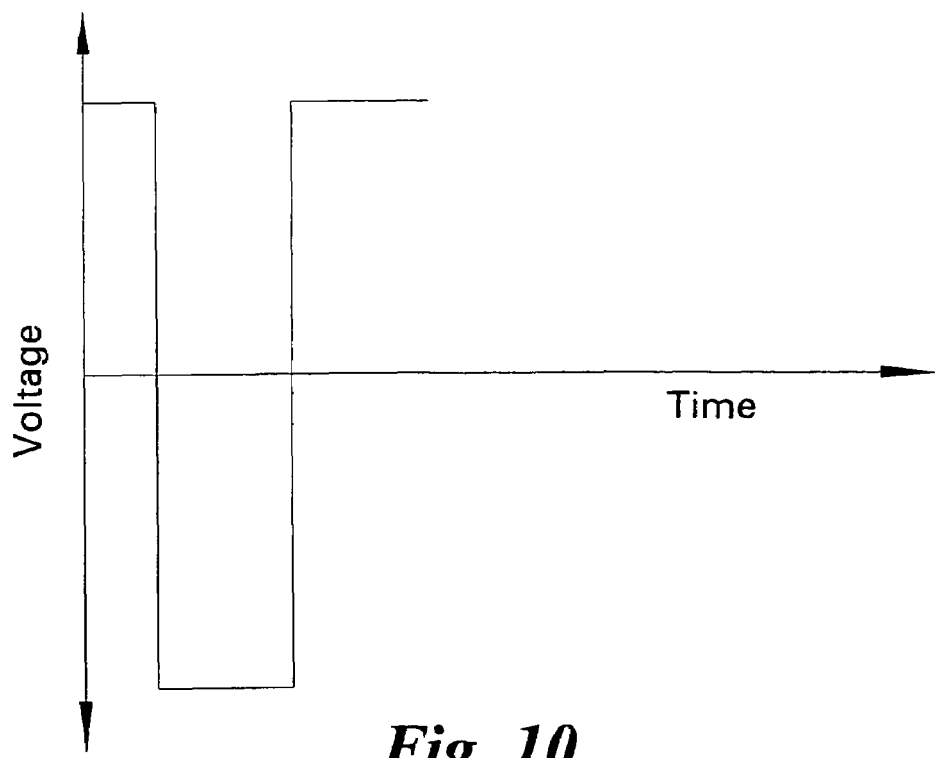

FIG. 10 shows a square wave pulse waveform where the length of time that the voltage is positive is approximately the same as the length of time that the voltage is positive, i.e., the period for positive voltage is the same as the period for negative voltage. However, in another embodiment of the present invention, the voltage waveform has a length of time that voltage is negative that is greater than the length of time that the voltage is positive. In another embodiment of the present invention, the voltage waveform utilized has a length of time that voltage is negative that is less than the length of time that the voltage is positive.

Referring again to FIGS. 5A and 5B, the converting circuit 72 in one embodiment of the present invention comprises, for example, back-to-back zener diodes. FIG. 6 shows an example of the converting circuit 72 with back-to-back zener diodes, 400 and 402, respectively. The zener diodes 400 and 402 are connected to the power source 32 with opposite polarity, as provided in FIG. 6. The zener diodes 400 and 402 are chosen so that the rating clamping voltage provided by the zener diodes 400 and 402 would provide a voltage to the OLED modules 38 that is close to the optimum operating voltage. Zener diodes 400 and 402 are typically not manufactured with a tight tolerance with regards to clamping voltage. Therefore, the voltage provided by the converting circuit 72 comprising back-to-back zener diodes 400 and 402 is typically a "clipped" sine wave waveform (assuming the input waveform is sinusoidal), not a true square wave. However, the "clipped" sine wave is typically sufficient in most applications, and a back-to-back zener diodes 400 and 402 converting circuit is typically cost effective.

The frequency of the voltage waveform output from the zener diode converting circuit 72 has the same frequency as the input waveform. In another embodiment of the present invention, the converting circuit 72 is constructed to provide a square wave pulse that is driven at a significantly higher frequency, i.e., >10 kHz, than cycle frequency input into the circuit. The drive frequency selected is dictated by the response time of the light emitting device 70.

Figure 7:
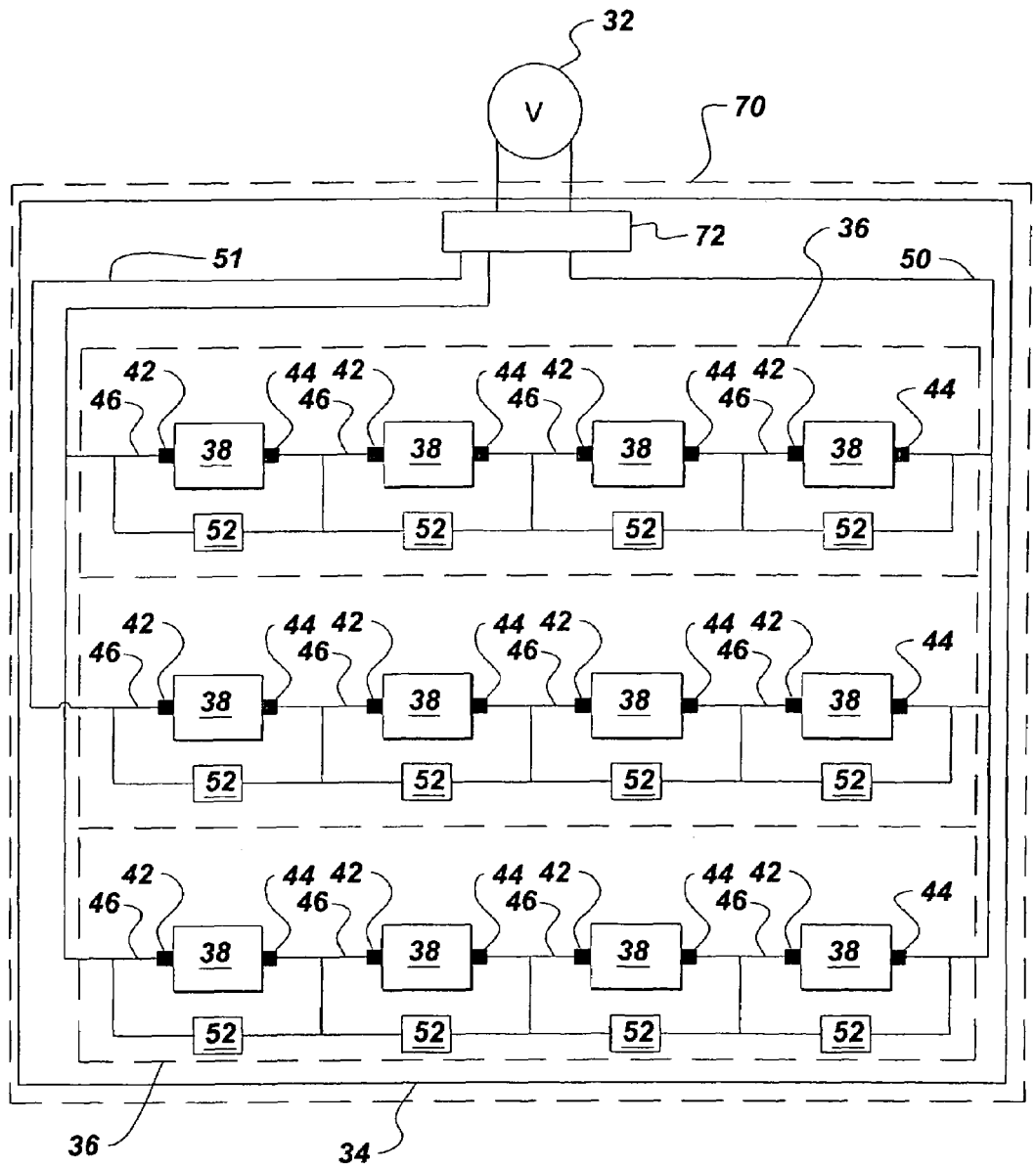
FIG. 7 is a drawing of a light emitting device according to another embodiment of the invention.

FIG. 7 shows another embodiment of the invention. The embodiment of FIG. 7 is the same as that of embodiment of FIG. 5 except that the converting circuit 72 has outputs for three conducting lines, two first conducting lines 48 and 51, and the second conducting line 50. Thus, the portion of the description of the embodiment of FIG. 7 that is the same as that of the embodiment of FIG. 5 is omitted here for the sake of brevity.

Figure 8:
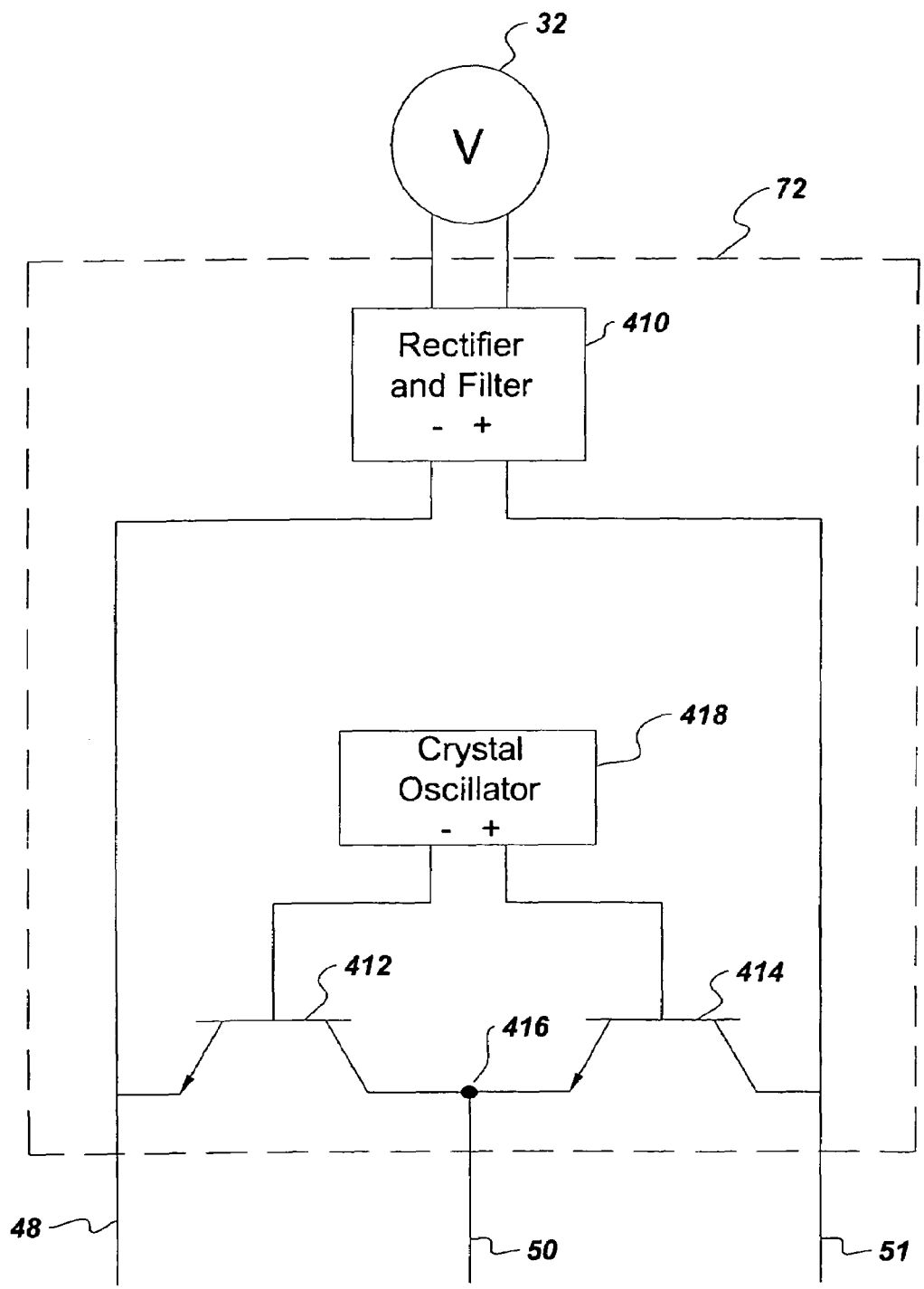
FIG. 8 is a drawing including a converting circuit for use with the embodiment of FIG. 7.

FIG. 8 shows another example of the converting circuit 72 that is used in the light emitting device 70 of FIG. 7. FIG. 8 provides a wave pulse that is typically driven at a higher frequency than the cycle frequency input into the circuit. The converting circuit 72 includes a rectifier and filter device 410, where the rectifier and filter device 410 are connected to the AC power source 32. The converting circuit 72 also includes two transistors 412 and 414 connected to each other at node 416 as shown in FIG. 8. The transistor 412 is also connected to one terminal of the rectifier and filter 410, while the other transistor 414 is connected to the other terminal of the rectifier and filter 410. The converting circuit 72 also includes a crystal oscillator 418, where one terminal of the crystal oscillator 418 is connected to one transistor 412, and the other terminal of the crystal oscillator 418 is connected to the other transistor 414. The crystal oscillator 418 determines the driving frequency of the waveform input to the OLED modules 38 via the lines 48, 50, and 51.

The transistors of the converting circuit 72 are selected from the group consisting of field effect transistors (FETS), complementary FETS (i.e. N and P channel FETS together), and combinations thereof. The use of FETS allows miniaturization of the light emitting device package. Additionally, the use of complementary FETS further reduces the package size. With minimal rectification of the input line voltage for cost effectiveness, the square wave pulse would necessarily have a modulation. However, it is believed that this would have an imperceptible effect on the light output.

A method of operating the light emitting device of the present invention is now described. In the simplest form, the light emitting device 10 of FIG. 1 is operated using an AC voltage waveform, which is not transformed prior to being applied to the OLED modules 12. In this case, a sinusoidal waveform line voltage is simply applied to one of the light emitting devices 10, 30 of FIG. 2, 60 of FIG. 3, and 61 of FIG. 4, and thus a sinusoidal waveform is applied to the OLED modules 12 of FIG. 1, 38 of FIG. 2, 38 of FIG. 3, and 38 of FIG. 4, respectively.

Alternatively, an AC waveform other than sinusoidal is applied to one of the light emitting devices 10 of FIG. 1, 30 of FIG. 2, 60 of FIG. 3, and 61 of FIG. 4. In one embodiment of the present invention, a square pulse voltage waveform is applied to one of the light emitting devices 10 of FIG. 1, 30 of FIG. 2, 60 of FIG. 3, and 61 of FIG. 4. Therefore, a square pulse voltage waveform is applied to the OLED modules 12 of FIG. 1, 38 of FIG. 2, 38 of FIG. 3, and 38 of FIG. 4, respectively.

As another alternative, a sinusoidal AC waveform is applied to the light emitting device of FIG. 5 or FIG. 7, and the sinusoidal waveform is then transformed to another waveform on the light emitting device itself. In this case, the device transformed waveform, such as a square pulse waveform, or "clipped" sine wave waveform, is then provided to the OLED modules 38.

Figure 11:
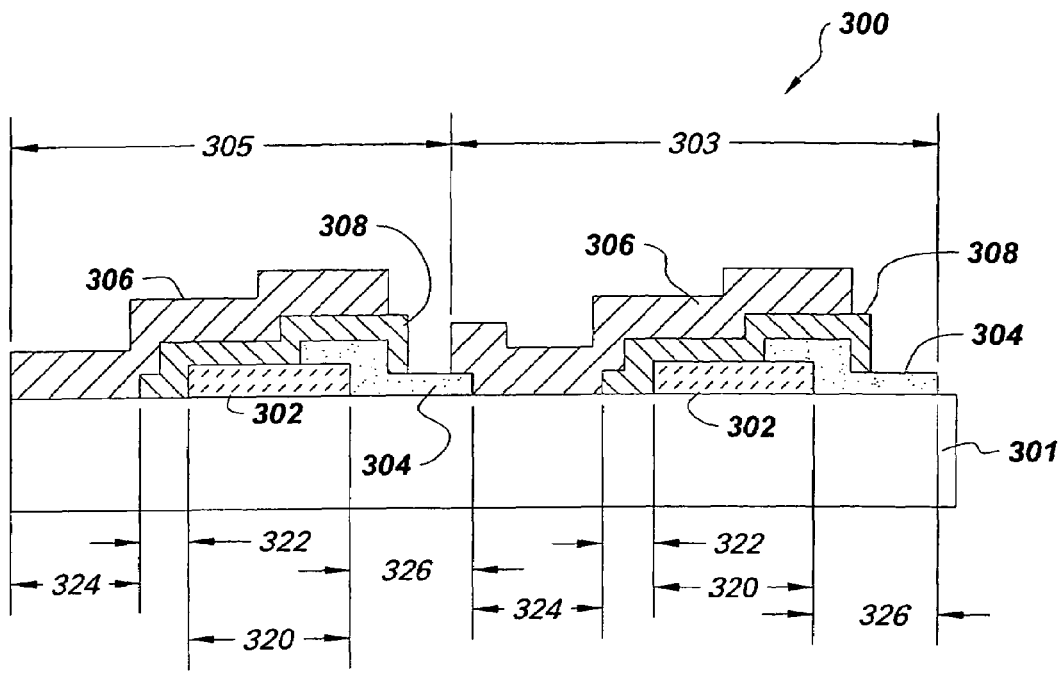
FIGS. 11 and 12 are a side view and top view, respectively, of a light emitting device according to another embodiment of the invention.
Figure 12:
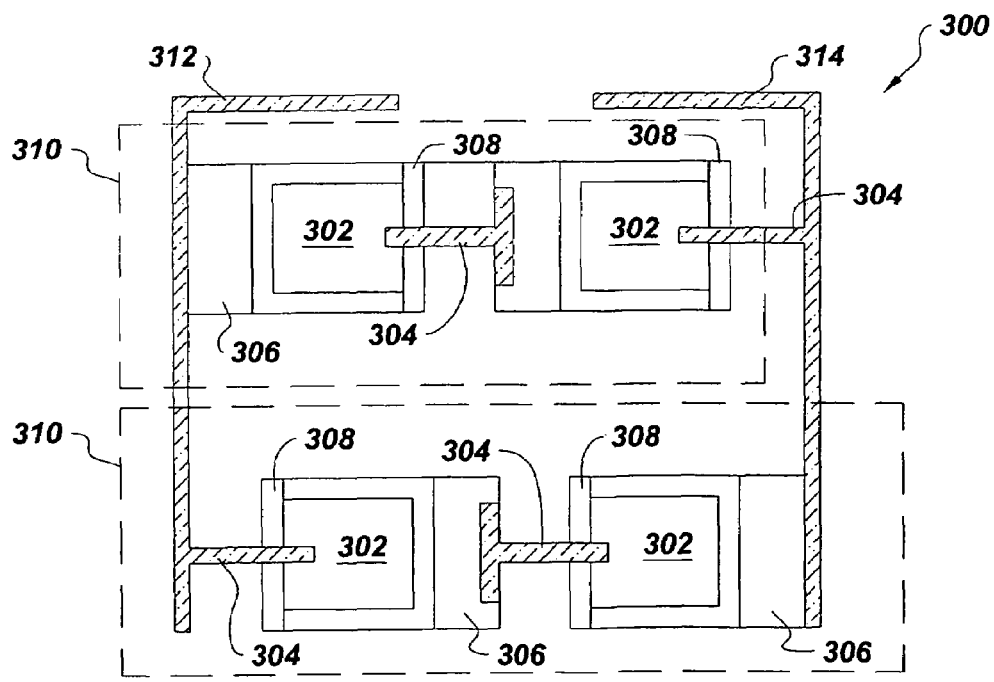

FIGS. 11 and 12 show a side view and top view, respectively, of another embodiment of the present invention. In FIG. 11, a light emitting device 300 includes a substrate 301. The substrate 301 is typically a glass or some other transparent substrate. A first OLED module 303 and a second OLED module 305 are disposed adjacent to one another. Collectively a first electrode 302, an interconnect 304, a second electrode 306, and a light emitting layer 308 form the first OLED module 303 and the second OLED module 305. The interconnect 304 provides electric connection between the first electrode 302 of first OLED module 303 and the respective second electrode (cathode) 306 of second OLED 305. The first electrode (anode) 302 of the first OLED module 303 is disposed on a first portion 320 of the substrate 301. The first electrode (anode) 302 of the second OLED module 305 is disposed on the first portion 320 of the substrate 301. The interconnect 304 is disposed on a portion of the first electrode 302 of the first OLED module 303 and a fourth portion 326 of the substrate 301. The interconnect 304 is disposed on the portion of the first electrode 302 of the second OLED module 305 and the fourth portion 326 of the substrate 301. The light emitting layer 308 is disposed over a second portion 322 of the substrate 301, a portion of the first electrode 302 of the first OLED module 303, and a portion of the interconnect 304 of the first OLDE module 303. The second electrode 306 is disposed on a third portion 324 of the substrate 301, a portion of the light emitting layer 308 of the first OLED module 303, and a portion of the interconnect 304 of the second OLED module 305. The first electrode 302 is typically optically transparent to allow light from the light emitting layer 308 to pass through the first electrode 302.

In one embodiment of the present invention, the first OLED module 303 and second OLED module 305 are connected in series. In another embodiment of the present invention, the first OLED module 303 and second OLED module 305 are connected in parallel.

As used herein, the terms "disposed on", "disposed from", "disposed to", "disposed over", "disposed above", "disposed between" and the like are used to refer to relative locations of items illustrated in the drawings and do not imply structural or operational limitations in the assembled device.

As seen in FIG. 12, groups of OLED modules 303, 305 are connected in series to form series groups 310. The opposing end electrodes of the series groups 310 are electrically connected, respectively, to a first conducting line 312 and a second conducting line 314. Preferably, the two series groups 310 are arranged such that the electrode of one of the series groups that is connected to the first conducting line 312, has the opposite polarity of the electrode of the other series group that is connected to the first conducting line 312. The first conducting line 312 and the second conducting line 314 are configured to be coupled to an external AC power source.

Figure 13:
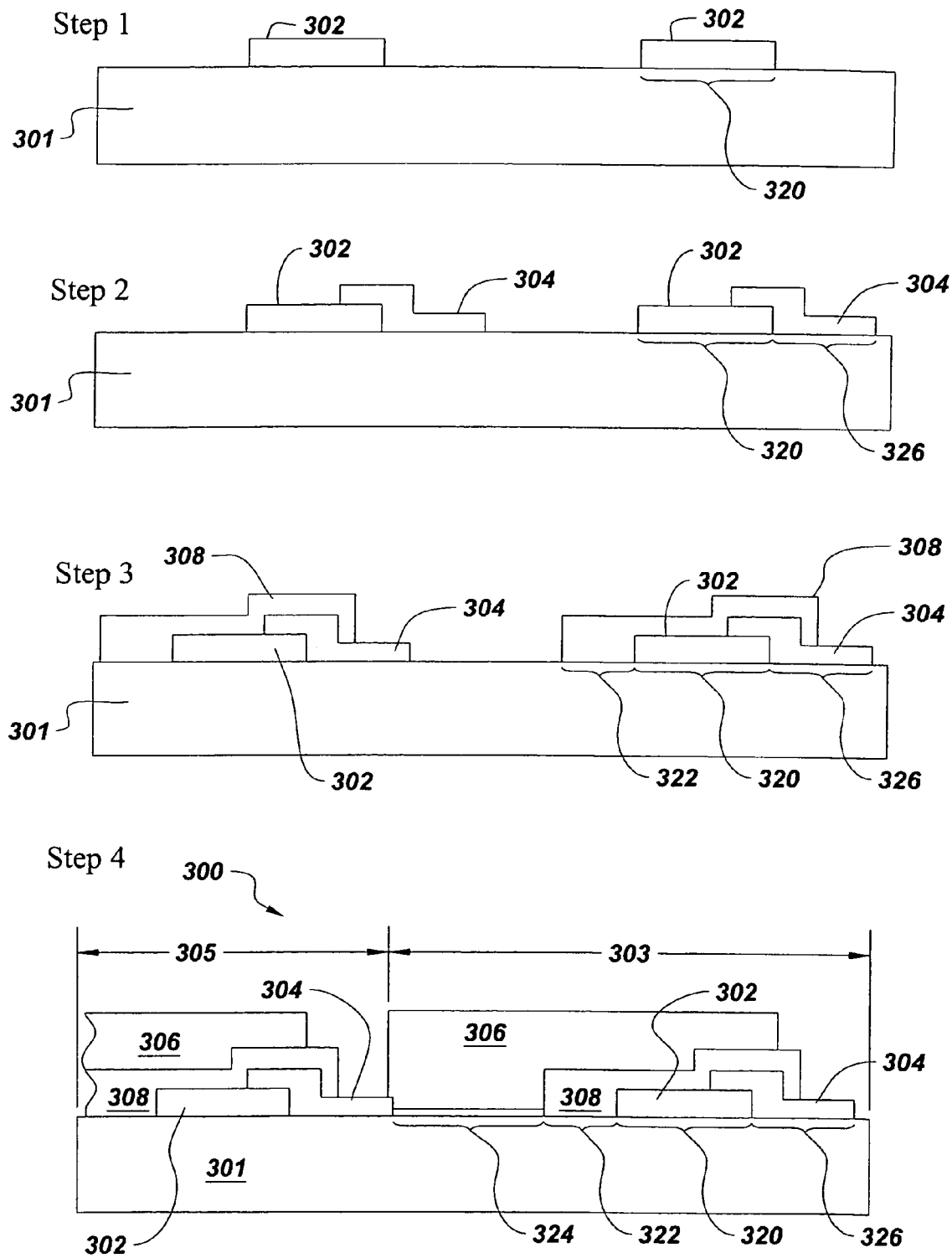
FIG. 13 illustrates a method of making the OLED module of FIG. 11 according to another embodiment of the present invention.

A method of making the light emitting device of FIG. 11 according to the present invention is now described with respect to FIG. 13. The light emitting device 300 comprises the plurality of OLED modules 303, 305. The plurality of OLED modules 303, 305 further comprises at least the first OLED module 303 and the second OLED module 305. In step 1 of FIG. 13, the method comprises disposing a respective first electrode 302 of each OLED module 38 on a respective portion of the substrate 301. In step 2, the method further comprises disposing the first electrode 302 of the first OLED module 303 on a first portion 320 of the substrate 301. The interconnect 304 is disposed on a portion of the first electrode 302 of the first OLED module 303 and a fourth portion 326 of the substrate 301. In step 3, the light emitting layer 308 is disposed on a second portion 322 of the substrate 301, a portion of the first electrode 302, and a portion of the interconnect 304. In step 4, the second electrode 306 is disposed over a third portion 324 of the substrate 301, a portion of the light emitting layer 308, and a portion of the interconnect 304 of the second OLED module 305. The second OLED module 305 is disposed adjacent to the first OLED module 303.

Figure 14:
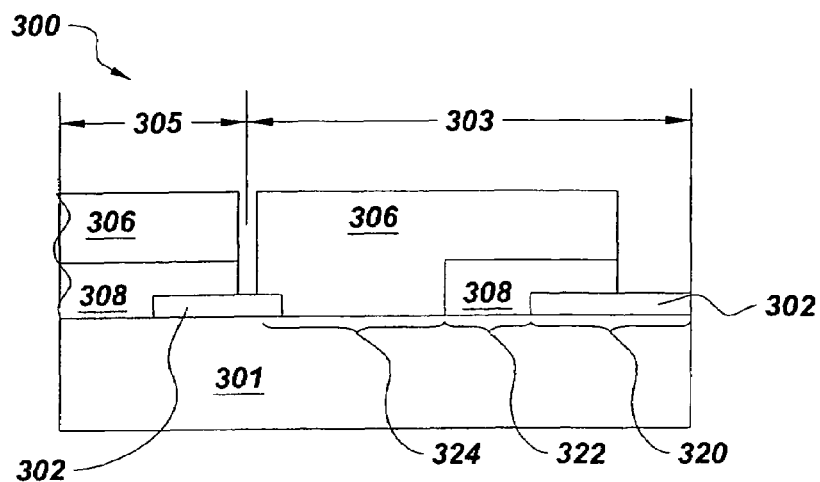
FIGS. 14 and 15 are a side view and top view, respectively, of a light emitting device according to another embodiment of the invention.
Figure 15:
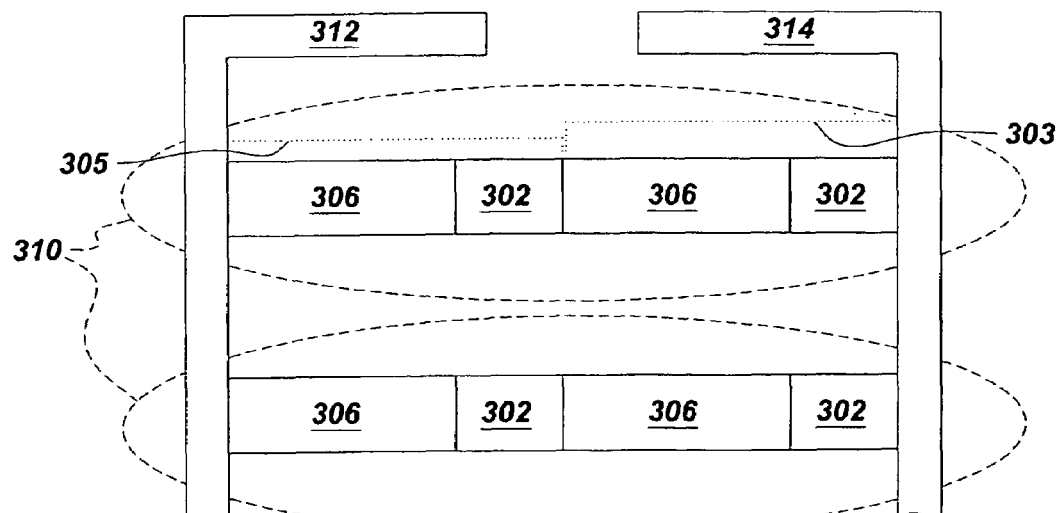

FIGS. 14 and 15 show a side view and top view, respectively, of another embodiment of the present invention. In FIG. 14, the light emitting device 300 includes the substrate 301. The first electrode 302 of the first OLED module 303 is disposed on the first portion 320 of the first OLED module 303. The light emitting layer 308 is disposed on the second portion 322 of the substrate 301 and a portion of the first electrode 302 of the first OLED module 303. The second electrode 306 is disposed over a third portion 324 of the substrate 301, a portion of the light emitting layer 308, and a portion of the first electrode 302 of the second OLED module 305. The first OLED module 303 and the second OLED module 305 are disposed adjacent to one another.

As seen in FIG. 15, groups of first OLED modules 303 and second OLED modules 305 are connected in series to form series groups 310. The opposing end electrodes of the series groups 310 are electrically connected, respectively to the first conducting line 312 and the second conducting line 314. In one embodiment of the present invention, the two series groups 310 are arranged such that the electrode of one of the series groups that is connected to the first conducting line 312, has the opposite polarity of the electrode of the other series group that is connected to the first conducting line 312. In one embodiment of the present invention, the first conducting line 312 and the second conducting line 314 are configured to be coupled to an external AC power source (not shown in FIG. 15).

Figure 16:
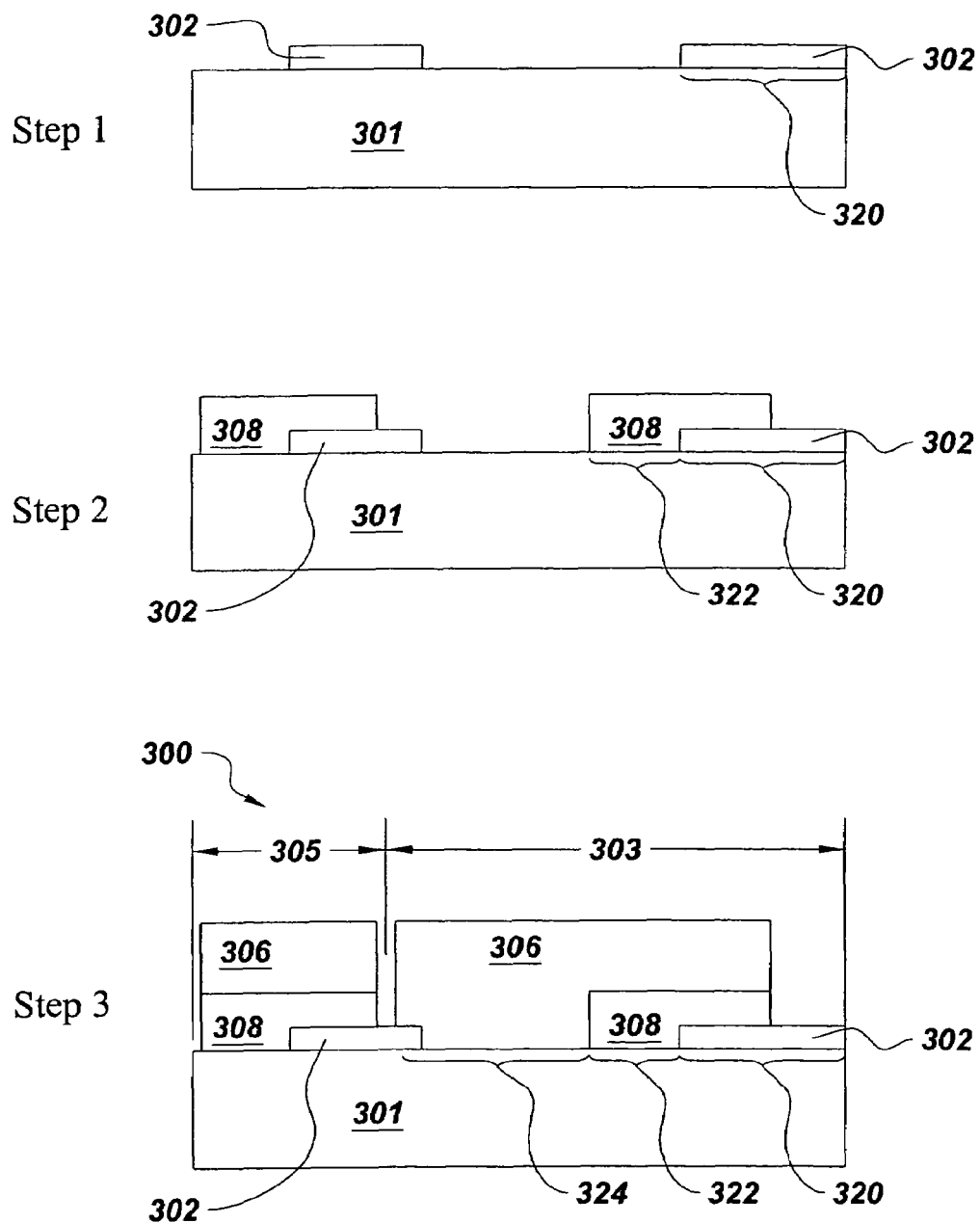
FIG. 16 illustrates a method of making the OLED module of FIG. 14 according to another embodiment of the present invention.
Figure 17:
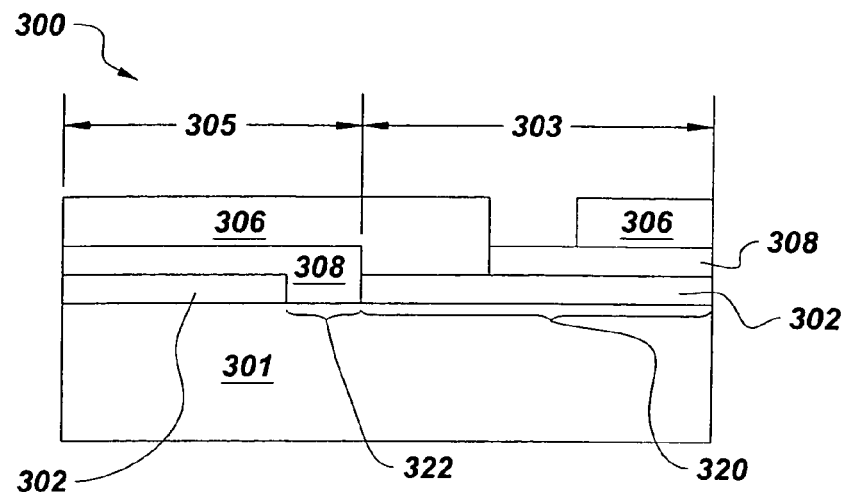
FIGS. 17 and 18 are a side view and top view, respectively, of a light emitting device according to another embodiment of the invention.
Figure 18:
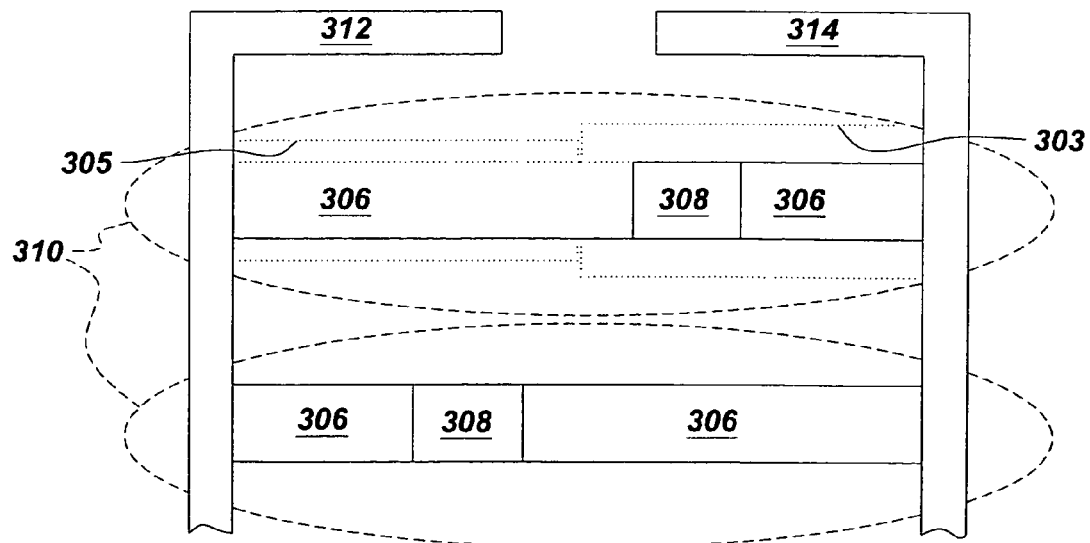

Another method of making the light emitting device of FIG. 14 according another embodiment of the present invention is now described with respect to FIG. 16. The light emitting device 300 comprises the plurality of OLED modules 303, 305. The plurality of OLED modules 303, 305 further comprises at least the first OLED module 303 and the second OLED module 305. The method comprises disposing a respective first electrode 302 of each OLED module 38 on a respective portion of a substrate 301. In step 1, the method comprises forming the first OLED module 303 by disposing the first electrode 302 of the first OLED module 303 on the first portion 320 of the substrate 301. In step 2, the method further comprises disposing the light emitting layer 308 on a second portion 322 of the substrate 301 and a portion of the first electrode 302 of the first OLED module 303. In step 3, the method further comprises disposing the second electrode 306 over a third portion 324 of the substrate 301, a portion of the light emitting layer 308, and a portion of the first electrode 302 of the second OLED module 305. The second OLED module 305 is disposed adjacent to the first OLED module 303.

Figure 20:
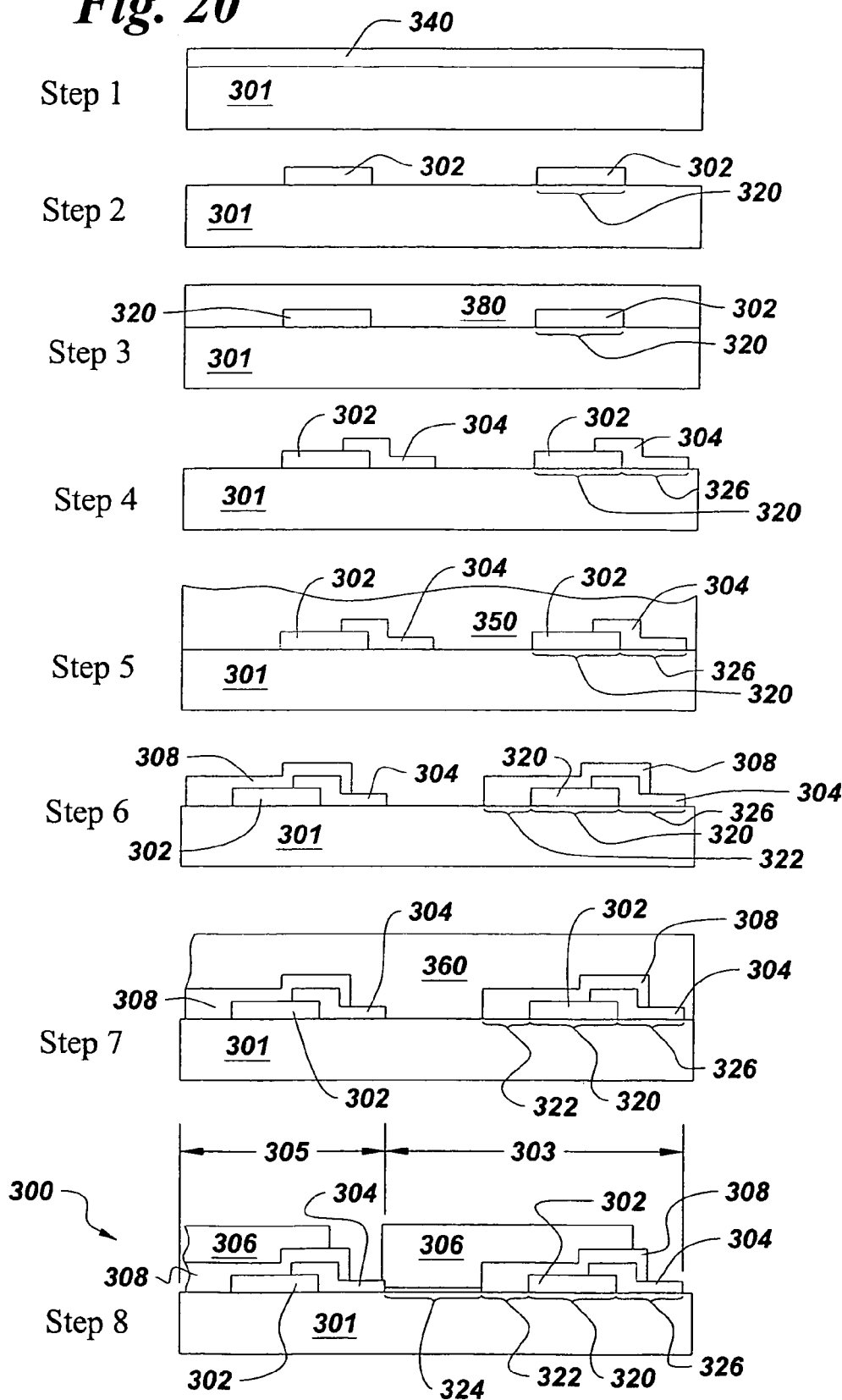
FIG. 20 illustrates a method of making an OLED module according to another embodiment of the present invention.

In another method embodiment of the present invention, a first conducting material 340 is deposited over the substrate 301 as shown in Step 1 of FIG. 20. In one method embodiment of the present invention, the first conducting material 340 is patterned to form the plurality of first electrodes 302 as depicted in Step 2. In another more specific embodiment of the present invention, the first conducting material is disposed onto the first portion 320 of the substrate 301 to form the plurality of first electrodes 302. In another specific embodiment of the present invention, a first conducting interconnect material 380 is disposed over the plurality of first electrodes 302 and a portion of the substrate 301 in Step 3. The first conducting interconnect material 380 is patterned to form a plurality of interconnects 304 in Step 4. In one embodiment of the present invention, each interconnect 304 is disposed between two adjacent OLED modules 303, 305 on the fourth portion of the substrate 301 and a portion of each first electrode 302.

In Step 5 of FIG. 20 the light emitting material 350 is disposed on the interconnects 304, a portion of the substrate 301, and a portion of the first electrodes 302. In Step 6, the light emitting material 350 is patterned to form the light emitting layer 308. In one embodiment of the present invention, the light emitting layer 308 is disposed on the second portion 322 of the substrate 301, a portion of the first electrode 302, and a portion of the interconnect 304. In one embodiment of the present invention, the light emitting layer 308 is formed by evaporating a light emitting material 350 through a shadow mask where the light emitting layer is disposed in electrical contact with the first conducting electrode 302. In another embodiment of the present invention, the light emitting layer 308 is formed by depositing the light emitting material 350 over the substrate 301, for example by a spin-on process. In one embodiment of the present invention, the light emitting layer 308 is formed by etching the deposited light emitting material 350 with an appropriate etchant. In one embodiment of the present invention, the light emitting layer 308 is formed by laser ablation of selected portions of the deposited light emitting material 350.

In Step 7 of FIG. 20, the second electrode material 360 is disposed over the third portion 324 of the substrate 301, the light emitting layer 308, and a portion of the interconnect 304. In step 8, the second electrode material 360 is patterned to form the plurality of second electrodes 306. In one method embodiment of the present invention, the second electrode 306 is disposed over the third portion 324 of the substrate 301, and the second electrode 306 is disposed on a portion of the light emitting layer 308 and a portion of the interconnect 304 of the adjacent second OLED module 305.

Figure 21:
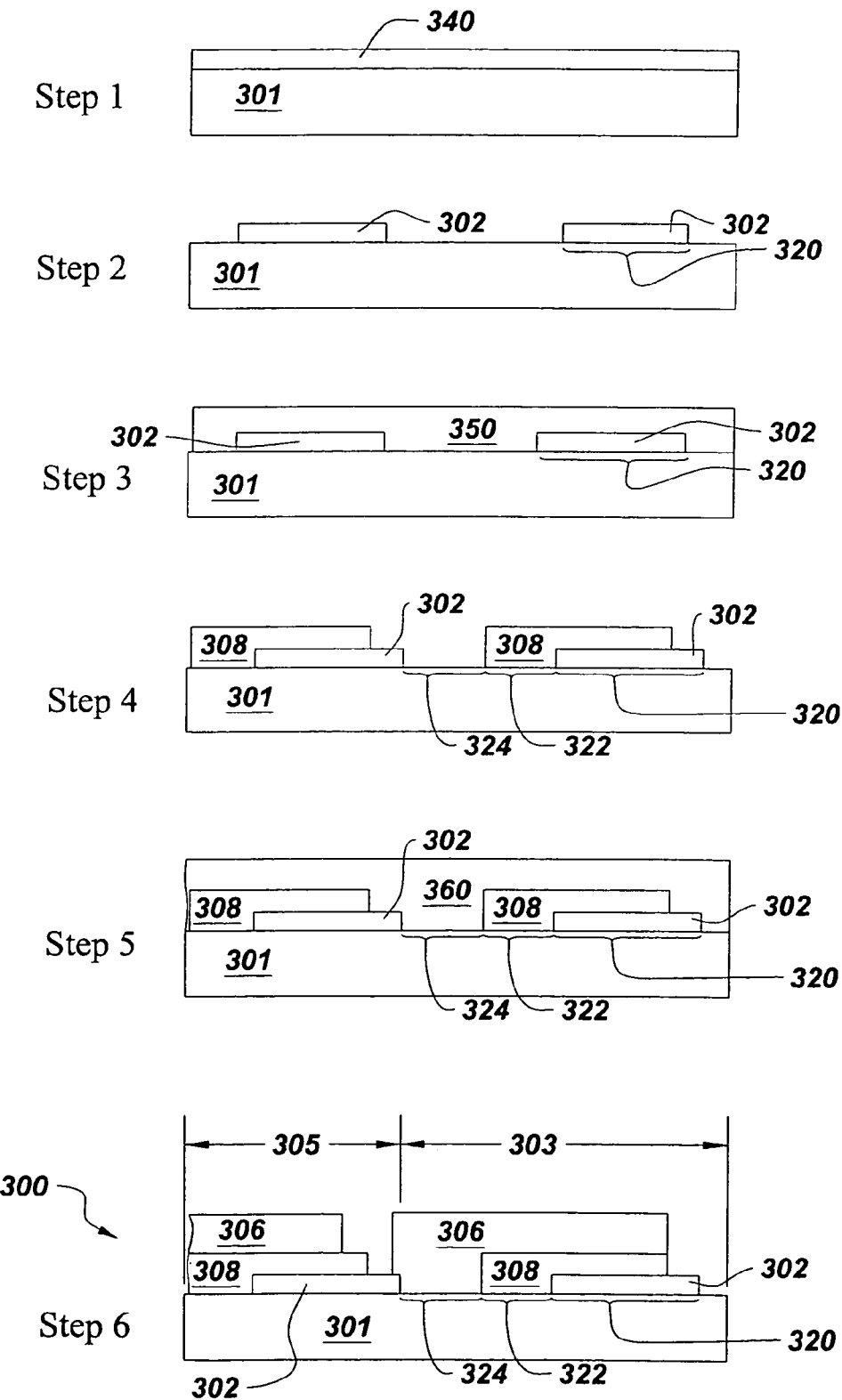
FIG. 21 illustrates a method of making an OLED module according to another embodiment of the present invention.

Another method embodiment of the present invention is provided in FIG. 21, where the first conducting material 340 is deposited over the substrate 301 in step 1 and the first conducting material 340 is patterned to form the plurality of first electrodes 302 in Step 2. Steps 1 and 2 of FIG. 21 are similar to the Steps 1 and 2 of FIG. 20 as described above. In another specific embodiment of the present invention, the light emitting material 350 of FIG. 21 is disposed over the plurality of first electrodes 302, the second portion 322 of the substrate 301, and the third portion 324 of the substrate 301 in step 3. In step 4, the light emitting material 350 is patterned to form the light emitting layer 308. In one embodiment of the present invention, the light emitting layer 308 is disposed on a portion of the respective first electrode 302 and the second portion 324 of the substrate 301.

In step 5 of FIG. 21 the second electrode material 360 is disposed over the third portion 324 of the substrate 301, a portion of the light emitting layer 308, and a portion of the first electrode 302. In Step 6, the second electrode material 360 is patterned to form the plurality of second electrodes 306. In one method embodiment of the present invention, the second electrode 306 is disposed over the third portion 324 of FIG. 16 of the substrate 301, and disposed on a portion of the light emitting layer 308, and a portion of the first electrode 320 of the adjacent second OLED module 305. In another method embodiment of the present invention, the second electrode 306 of FIG. 14 is disposed on the third portion 324 of the substrate 301, a portion of the light emitting layer 308, and a portion of the first electrode 320 of the adjacent second OLED module 305.

In one embodiment of the present invention, the first conducting electrode material 340 of FIG. 21 and the plurality of first electrodes 302 comprises at least one conducting transparent material such as indium tin oxide (ITO), tin oxide, nickel, or gold. In one embodiment of the present invention, the first conducting interconnect material 380 of FIG. 20 is selected from the group consisting of copper, aluminum, titanium, and any combination thereof. In another embodiment of the present invention, the first conducting interconnect material 380 and the first electrode 302 are comprised of an organic conductor such as poly(3,4)ethylenedioxythiophene/polystyrenesulphonate (PEDT/PSS), for example, available from Bayer Corporation, which is applied by conventional methods such as spin coating.

In another embodiment of the present invention, the first conducting electrode 302 is formed by depositing the first conducting material 340 selectively onto the substrate. In a more specific embodiment of the present invention, the first conducting material 340 is blanket deposited and then masked and etched to pattern the first conducting electrode 302. For example, the first conducting material 340 is deposited by sputtering. In another embodiment of the present invention, the interconnect 304 is formed by depositing the first conducting interconnect material 380 over and in contact with the first conducting electrode 302. The first conducting interconnect material 380 is then masked and etched to form the interconnect 304.

In a specific embodiment of the present invention, the first electrode 302 and interconnect 304 are formed of the same material, and they are typically formed by first depositing a single layer and then performing a single mask and etch process to form a combination first electrode 302 and interconnect 304.

In another embodiment, the light emitting layer 308 is formed by selectively depositing the light emitting material 350 over the substrate 301 and in electrical contact with the first electrode 302, such as by ink jet printing.

After the light emitting layer 308 is formed, the second electrode 306 is formed. In one embodiment of the present invention, the second electrode 306 is formed by evaporating the second conducting material 360 through a shadow mask. In one embodiment of the present invention, the second conducting material 360 is selected from the group consisting of calcium, gold, indium, manganese, tin, lead, aluminum, silver, magnesium, a magnesium/silver alloy, and combinations thereof. In one embodiment of the present invention, the second electrode 306 is formed by a blanket deposition of the second conducting material 360. The second conducting material 360 is then patterned by etching to form the second electrode 306.

The first conducting line 312 and second conducting line 314 are formed, for example, by depositing a conducting material such as aluminum or copper, and patterning the conducting material to form the lines. Alternatively, the first and second conducting lines 312 and 314 are formed by selective deposition, such as by a plating process.

I. The Components of the OLED Module

Figure 22:
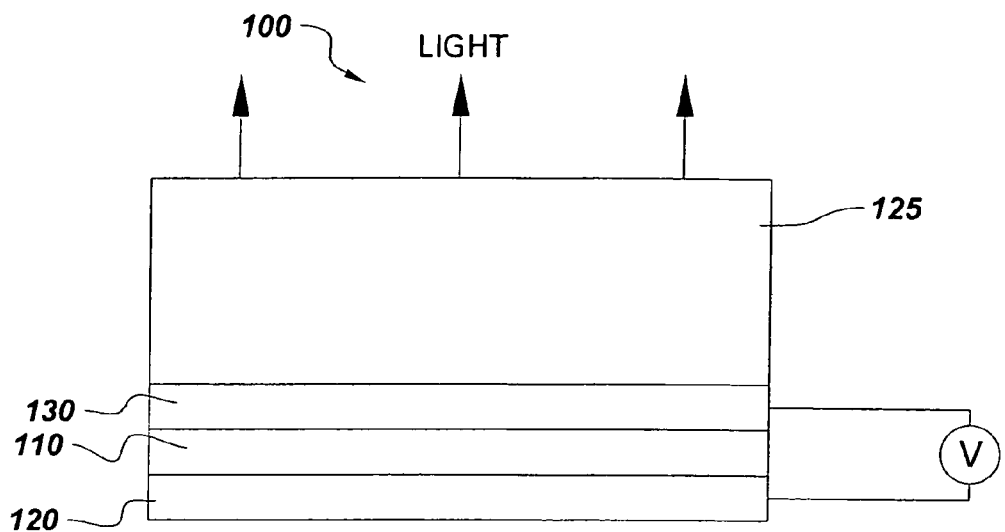
FIGS. 22-26 illustrate various examples of light emitting layers formed of two or more sublayers.

The OLED module 100 of FIG. 22 of the present invention comprises any type of organic light emitting device, such as an OLED device. The term "light" includes visible light as well as UV and IR radiation. The OLED module 100 includes the light emitting layer 110 disposed between two electrodes, e.g., the first electrode (cathode) 120 and the second electrode (anode) 130. The light emitting layer 110 emits light upon application of a voltage across the second electrode 130 and first electrode 120 from the voltage source "V". The OLED module 100 typically includes a device substrate 125, such as glass or transparent plastics such as PET (MYLAR®), polycarbonate, and the like, as shown in FIG. 22. As used herein, the term "OLED module" generally refers to the combination, which includes at least the light emitting layer 110, the first electrode 120, and the second electrode 130. In one embodiment of the present invention, the OLED module 100 further comprises the device substrate 301. In one embodiment of the present invention, the OLED module 100 further comprises the device substrate 301 and device electrical contacts. In one embodiment of the present invention, the OLED module 100 further comprises the device substrate 301, electrical contacts, and a photoluminescent layer 135. The photoluminescent layer 135 will be described below.

A. The Electrodes

The second electrode 130 and the first electrode 120 inject charge carriers, i.e., holes and electrons, into the light emitting layer 110 where the holes and the electrons recombine to form excited molecules or excitons which emit light when the molecules or excitons decay. The color of light emitted by the molecules depends on the energy difference between the excited state and the ground state of the molecules or excitons. Typically, the applied voltage is about 3-10 volts, however, in another embodiment of the present invention the applied voltage is up to 30 volts or more, and the external quantum efficiency (photons out/electrons in) is between 0.01% and 5%, but could be up to 10%, 20%, 30%, or more. The light emitting layer 110 typically has a thickness of about 50-500 nanometers, and the electrodes 120, 130 each typically have a thickness of about 100-1000 nanometers.

The first electrode 120 generally comprises a material having a low work function value such that a relatively small voltage causes emission of electrons from the cathode. In one embodiment of the present invention, the first electrode 120 is selected from the group consisting of calcium, gold, indium, manganese, tin, lead, aluminum, silver, magnesium, magnesium/silver alloy, and combinations thereof. In another embodiment of the present invention, the first electrode 120 comprises two layers to enhance electron injection. In one specific embodiment of the present invention, the first electrode 120 is selected from the group consisting of a thin inner layer of LiF followed by a thicker outer layer of aluminum, a thin inner layer of LiF followed by a thicker outer layer of silver, a thin inner layer of calcium followed by a thicker outer layer of aluminum, a thin inner layer of calcium followed by a thicker outer layer of silver, and combinations thereof.

The second electrode 130 typically comprises a material having a high work function value. The second electrode 130 is typically transparent so that light generated in the light emitting layer 110 propagates out of the OLED module 100. In one embodiment of the present invention, the second electrode 130 is selected from the group consisting of indium tin oxide (ITO), tin oxide, nickel, gold, and combinations thereof. The electrodes 120, 130 are formed by conventional vapor deposition techniques, such as evaporation or sputtering, for example.

B. The Organic Emitting Layer(s)

Figure 19:
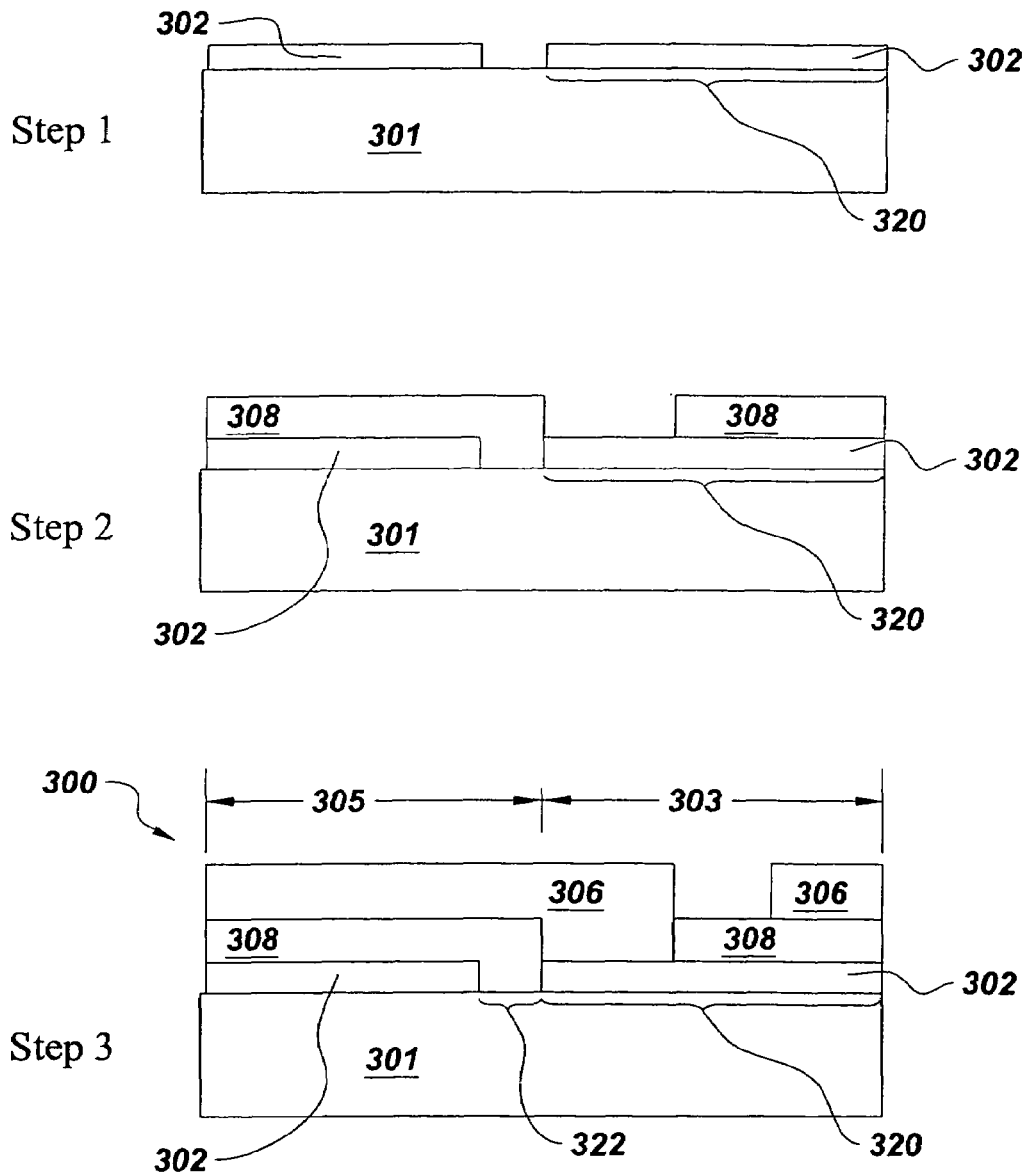
FIG. 19 illustrates a method of making the OLED module of FIG. 17 according to another embodiment of the present invention.

A variety of light emitting layers 110 is used in conjunction with exemplary embodiments of the invention. According to one embodiment shown in FIG. 19, the light emitting layer 110 comprises a single layer. In one specific embodiment of the present invention, the light emitting layer 110 comprises a conjugated polymer. The conjugated polymer is luminescent. In one embodiment of the present invention, the conjugated polymer comprises a hole-transporting polymer doped with electron transport molecules and a luminescent material.

In another embodiment of the present invention, the conjugated polymer comprises an inert polymer doped with hole transporting molecules and a luminescent material. In another embodiment of the present invention, the light emitting layer 110 comprises an amorphous film of luminescent small organic molecules doped with other luminescent molecules.

According to other embodiments of the invention shown in FIGS. 23-26, the light emitting layer 110 comprises two or more sublayers, which carry out the functions of hole injection, hole transport, electron injection, electron transport, and luminescence. The light emitting layer 110 is required to perform the at least the luminescence function in order to be a functioning device. However, the additional sublayers generally increase the efficiency with which holes and electrons recombine to produce light. Thus, the light emitting layer 110 comprises 14 sublayers including, for example, a hole injection sublayer, a hole transport sublayer, a luminescent sublayer, and an electron injection sublayer. In one embodiment of the present invention, one or more sublayers comprise a material that achieves two or more functions such as hole injection, hole transport, electron injection, electron transport, and luminescence.

Embodiments in which the light emitting layer 110 comprises a single layer, as shown in FIG. 22, will now be described. According to one embodiment, the light emitting layer 110 comprises a conjugated polymer. The term conjugated polymer refers to a polymer, which includes a delocalized π-electron system along the backbone of the polymer. The delocalized π-electron system provides semiconducting properties to the polymer and gives it the ability to support positive and negative charge carriers with high mobilities along the polymer chain. The polymer film has a sufficiently low concentration of extrinsic charge carriers that on applying an electric field between the electrodes, charge carriers are injected into the polymer and radiation is emitted from the polymer. Conjugated polymers are discussed, for example, in R. H. Friend, 4 Journal of Molecular Electronics 37-46 (1988).

One example of a conjugated polymer, which emits light upon application of a voltage, is PPV (poly(p-phenylenevinylene)). PPV emits light in the spectral range of about 500-690 nanometers and has good resistance to thermal and stress induced cracking. A suitable PPV film typically has a thickness of about 100-1000 nanometers. The PPV film is formed by spin coating a solution of the precursor to PPV in methanol onto a substrate and heating in a vacuum oven.

Various modifications are made to the PPV while retaining its luminescent properties. In one embodiment, the phenylene ring of the PPV carries one or more substituents each independently selected from alkyl, alkoxy, halogen, nitro, and combinations thereof. In another embodiment, other conjugated polymers derived from PPV are used in conjunction with exemplary embodiments of the invention. In one specific embodiment of the present invention, one derivative of PPV includes polymers derived by replacing the phenylene ring with a fused ring system, e.g. replacing the phenylene ring with an anthracene or napthalene ring system. In another specific embodiment of the present invention, another derivative of PPV includes the alternative ring systems, where the alternative ring systems also carries one or more substituents of the type described above with respect to the phenylene ring, including polymers derived by replacing the phenylene ring with a heterocyclic ring system such as a furan ring. In another specific embodiment of the present invention, another derivative of PPV includes having the furan ring carry one or more substituents of the type described above in connection with the phenylene ring, including polymers derived by increasing the number of vinylene moieties associated with each phenylene or other ring system. The above described derivatives have different energy gaps, which allow flexibility in producing a light emitting layer 110 that emits light in a desired color range or ranges. Additional information on luminescent conjugated polymers is described in U.S. Pat. No. 5,247,190, which is hereby incorporated by reference.

Other examples of suitable conjugated polymers include polyfluorenes such as 2,7-substituted-9-substituted fluorenes and 9-substituted fluorene oligomers and polymers. Polyfluorenes generally have good thermal and chemical stability and high solid-state fluorescence quantum yields. In one embodiment of the present invention, the fluorenes, oligomers and polymers are substituted at the 9-position with 1) two hydrocarbyl moieties which contain one or more of sulfur, nitrogen, oxygen, phosphorous or silicon heteroatoms; 2) a $C_{5-20}$ ring structure formed with the 9-carbon on the fluorene ring, and 3) a $C_{4-20}$ ring structure formed with the 9-carbon containing one or more heteroatoms of sulfur, nitrogen or oxygen; or a hydrocarbylidene moiety. According to one embodiment, the fluorenes are substituted at the 2- and 7-positions with aryl moieties which are further be substituted with moieties which are capable of crosslinking or chain extension or a trialkylsiloxy moiety. In another embodiment of the present invention, the fluorene polymers and oligomers are substituted at the 2- and 7-positions. The monomer units of the fluorene oligomers and polymers are bound to one another at the 2- and 7-positions. In one embodiment of the present invention, the 2, 7-aryl-9-substituted fluorene oligomers and polymers are further reacted with one another to form higher molecular weight polymers by causing the optional moieties on the terminal 2, 7-aryl moieties, which are capable of crosslinking or chain extension, to undergo chain extension or crosslinking.

The above described fluorenes and fluorene oligomers or polymers are readily soluble in common organic solvents. They are processable into thin films or coatings by conventional techniques such as spin coating, spray coating, dip coating and roller coating. Upon curing, such films demonstrate resistance to common organic solvents and high heat resistance. Additional information on such polyfluorenes is described in U.S. Pat. No. 5,708,130, which is hereby incorporated by reference.

In another embodiment of the present invention, other suitable polyfluorenes include poly(fluorene) copolymers, such as poly(fluorene-co-anthracene)s, which exhibit blue electroluminescence. These copolymers include a polyfluorene subunit such as 2,7-dibromo-9,9-di-n-hexylfluorene (DHF) and another subunit such as 9,10-dibromoanthracene (ANT). High molecular weight copolymers from DHF and ANT are prepared by the nickel-mediated copolymerization of the corresponding aryl dibromides. The final polymer molecular weight is controlled by adding the end capping reagent 2-bromofluorene at different stages of the polymerization. The copolymers are thermally stable with decomposition temperatures above 400° C. and are soluble in common organic solvents such as tetrahydrofuran (THF), chloroform, xylene, or chlorobenzene. They emit blue light having a wavelength of about 455 nm. Additional information on such polyfluorenes is described in Gerrit Klarner et al., "Colorfast Blue Light Emitting Random Copolymers Derived from Di-n-hexylfluorene and Anthracene", 10 Adv. Mater. 993-997 (1998), which is hereby incorporated by reference. In a specific embodiment of the present invention, a blue light emitting polyfluorine is poly(9,9-di-n-hexylfluorine-2,7-diyl), is utilized that has a broad double emission peak between about 415 and 460 nm.

According to another embodiment of a single layer module 200 as shown in FIG. 22, the light emitting layer 110 comprises a molecularly doped polymer. A molecularly doped polymer typically comprises a binary solid solution of charge transporting molecules, which are molecularly dispersed in an inert polymeric binder. The charge transporting molecules enhance the ability of holes and electrons to travel through the doped polymer and recombine. The inert polymer offers many alternatives in terms of available dopant materials and mechanical properties of the host polymer binder.

One example of a molecularly doped polymer comprises poly(methyl methacrylate) (PMMA) molecularly doped with the hole transporting molecule N,N'-diphenyl-N,N'-bis(3-methylphenyl)-1,1'-biphenyl-4,4'-diamine (TPD) and the luminescent material tris(8-quinolinolato)-aluminum(III) (Alq). TDP has a high hole drift mobility of $10^{-3}$ cm$^2$/volt-sec, while Alq is a luminescent metal complex having electron transporting properties in addition to its luminescent properties.

The doping concentration is typically about 50%, while the molar ratio of TDP to Alq varies from about 0.4 to 1.0, for example. In one embodiment of the present invention, a film of the doped PMMA is prepared by mixing a dichloroethane solution containing suitable amounts of TPD, Alq, and PMMA, and dip coating the solution onto the desired substrate, e.g. an indium tin oxide (ITO) electrode. The thickness of the doped PMMA layer is typically about 100 nanometers. When activated by application of a voltage, a green emission is generated. Additional information on such doped polymers is described in Junji Kido et al., "Organic Electroluminescent Devices Based on Molecularly Doped Polymers", 61 Appl. Phys. Lett. 761-763 (1992), which is hereby incorporated by reference.

Figure 23:
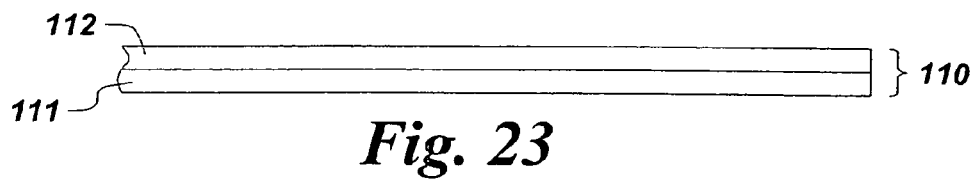

According to another embodiment of the OLED module 200 of the invention shown in FIG. 23, the light emitting layer 110 comprises two sublayers. The first sublayer 111 provides hole transport, electron transport, and luminescent properties and is positioned adjacent the first electrode 120. The second sublayer 112 serves as a hole injection sublayer and is positioned adjacent the second electrode 130. The first sublayer 111 comprises a hole-transporting polymer doped with electron transporting molecules and a luminescent material, e.g. a dye or polymer. In one embodiment of the present invention, the hole-transporting polymer comprises poly(N-vinylcarbazole) (PVK). In another embodiment of the present invention, the electron transport molecules comprise 2-(4-biphenyl)-5-(4-tert-butylphenyl)-1,3,4-oxadiazole (PBD). The luminescent material typically comprises small molecules or polymers, which act as emitting centers to vary the emission color. In one embodiment of the present invention, the luminescent materials is selected from the group consisting of the organic dyes coumarin 460 (blue), coumarin 6 (green), nile red and combinations thereof. In one embodiment of the present invention, thin films of these blends are formed by spin coating a chloroform solution containing different amounts of PVK, electron transport molecules, and luminescent materials. For example, a suitable mixture comprises 100 weight percent PVK, 40 weight percent PBD, and 0.2-1.0 weight percent organic dyes.

The second sublayer 112 serves as a hole injection sublayer and in one embodiment of the present invention comprises poly(3,4)ethylenedioxythiophene/polystyrenesulphonate (PEDT/PSS), for example, available from Bayer Corporation, which is applied by conventional methods such as spin coating. Additional information on hole-transporting polymers doped with electron transporting molecules and a luminescent material is described in Chung-Chih Wu et al., "Efficient Organic Electroluminescent Devices Using Single-Layer Doped Polymer Thin Films with Bipolar Carrier Transport Abilities", 44 IEEE Trans. on Elec. Devices 1269-1281 (1997), which is hereby incorporated by reference.

Figure 24:
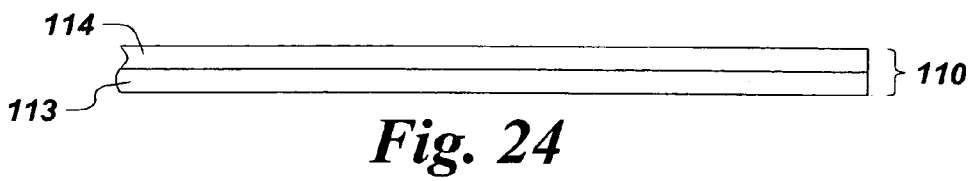

According to another embodiment of the OLED module 100 of the invention shown in FIG. 24, the light emitting layer 110 comprises a luminescent sublayer 113 and a hole transporting sublayer 114. In one embodiment of the present invention, the hole transporting sublayer 114 comprises an aromatic amine that is readily and reversibly oxidizable. One example of such a luminescent sublayer and a hole transporting sublayer is described in A. W. Grice et al, "High Brightness and Efficiency of Blue Light-Emitting Polymer Diodes", 73 Appl. Phys. Letters 629-631 (1998), which is hereby incorporated by reference. The device described therein comprises two polymer layers sandwiched between an ITO electrode and a calcium electrode. The polymer layer next to the ITO is a hole transport layer and comprises a polymeric triphenyl-diamine derivative (poly-TPD). The blue emitting polymer layer, which is next to, the calcium electrode is poly(9,9-dioctylfluorene).

Figure 25:
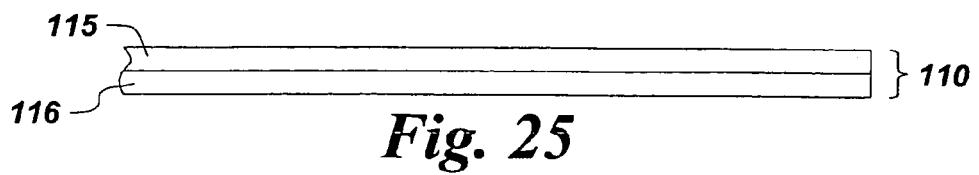

According to another embodiment of the OLED module 100 of the invention shown in FIG. 25, the light emitting layer 110 comprises a first sublayer 115 which includes luminescent and hole transport properties, and a second sublayer 116, which includes electron injection properties. The first sublayer 115 comprises a polysilane, and the second sublayer comprises an oxadiazole compound. This structure produces ultraviolet (UV) light.

Polysilanes are linear silicon (Si)-backbone polymers substituted with a variety of alkyl and/or aryl side groups. In contrast to π-conjugated polymers, polysilanes are quasi one-dimensional materials with delocalized σ-conjugated electrons along the polymer backbone chain. Due to their one-dimensional direct-gap nature, polysilanes exhibit a sharp photoluminescence with a high quantum efficiency in the ultraviolet region. Examples of suitable polysilanes include poly(di-n-butylsilane) (PDBS), poly(di-n-pentylsilane) (PDPS), poly(di-n-hexylsilane) (PDHS), poly(methyl-phenylsilane) (PMPS), and poly[-bis(p-butylphenyl)silane] (PBPS). In one embodiment of the present invention, the polysilane sublayer 115 is applied by spin coating from a toluene solution. In another embodiment of the present invention, the electron injection sublayer 116 comprises 2,5-bis(4-biphenyl)-1,3,4-oxadiazole (BBD). Additional information on UV-emitting polysilane light emitting layers is described in Hiroyuki Suzuki et al, "Near-ultraviolet Electroluminescence from Polysilanes", 331 Thin Solid Films 64-70 (1998), which is hereby incorporated by reference.

Figure 26:
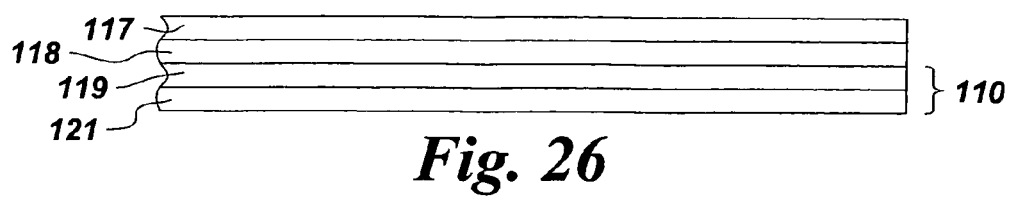

According to another embodiment of the OLED module 100 of the invention shown in FIG. 26, the light emitting layer 110 comprises a hole injecting sublayer 117, a hole transporting sublayer 118, a luminescent sublayer 119, and an electron injecting sublayer 121. The hole injecting sublayer 117 and hole transporting sublayer 118 efficiently provide holes to the recombination area. The electrode injecting sublayer 121 efficiently provides electrons to the recombination area.

In one embodiment of the present invention, the hole injecting sublayer 117 comprises a porphyrinic compound selected from the group consisting of a metal free phthalocyanine, a metal containing phthalocyanine, and combinations thereof. In another embodiment of the present invention, the hole transporting sublayer 118 comprises a hole transporting aromatic tertiary amine. In one specific embodiment of the present invention, the aromatic tertiary amine is a compound containing at least one trivalent nitrogen atom that is bonded only to carbon atoms, at least one of which is a member of an aromatic ring. In another specific embodiment of the present invention, the luminescent sublayer 119 comprises, for example, a mixed ligand aluminum chelate emitting in the blue wavelengths, such as bis(R-8-quinolinolato)-(phenolato)aluminum(III) chelate where R is a ring substituent of the 8-quinolinolato ring nucleus chosen to block the attachment of more than two 8-quinolinolato ligands to the aluminum atom. In another specific embodiment of the present invention, the electron injection sublayer 121 comprises a metal oxinoid charge accepting compound. In one specific embodiment of the present invention, the metal oxinoid charge accepting compound is a tris-chelate of aluminum. Additional information on such four-layer materials and devices are described in U.S. Pat. No. 5,294,870, which is hereby incorporated by reference.

The artisan skilled in the art is left to utilize the above examples of light emitting layers 110 to design the OLED that emits light in one or more desired colors based on the lighting application. Based on the above information the artisan is left to design the OLED module 100 that emits light where the light color is selected from the group consisting of ultraviolet, blue, green, red light, and combinations thereof.

C. Sealing Member and Contacts

Figure 27:
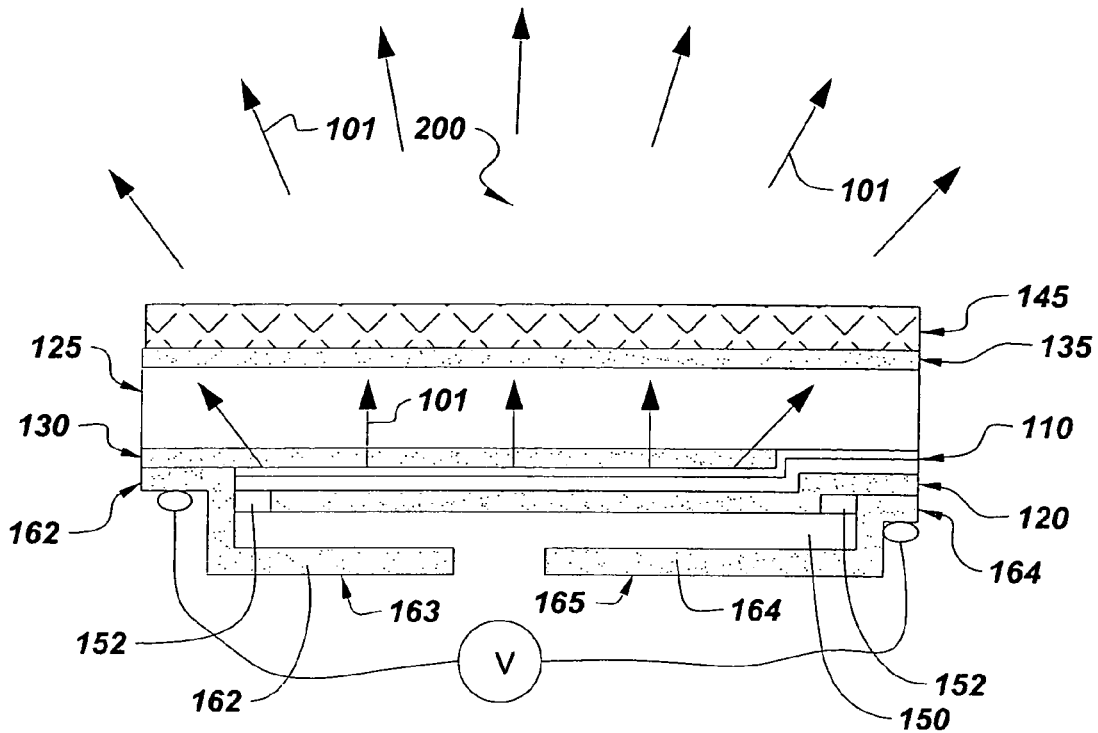
FIG. 27 is a side view of an OLED module of a light emitting device according to another embodiment of the invention.
Figure 28:
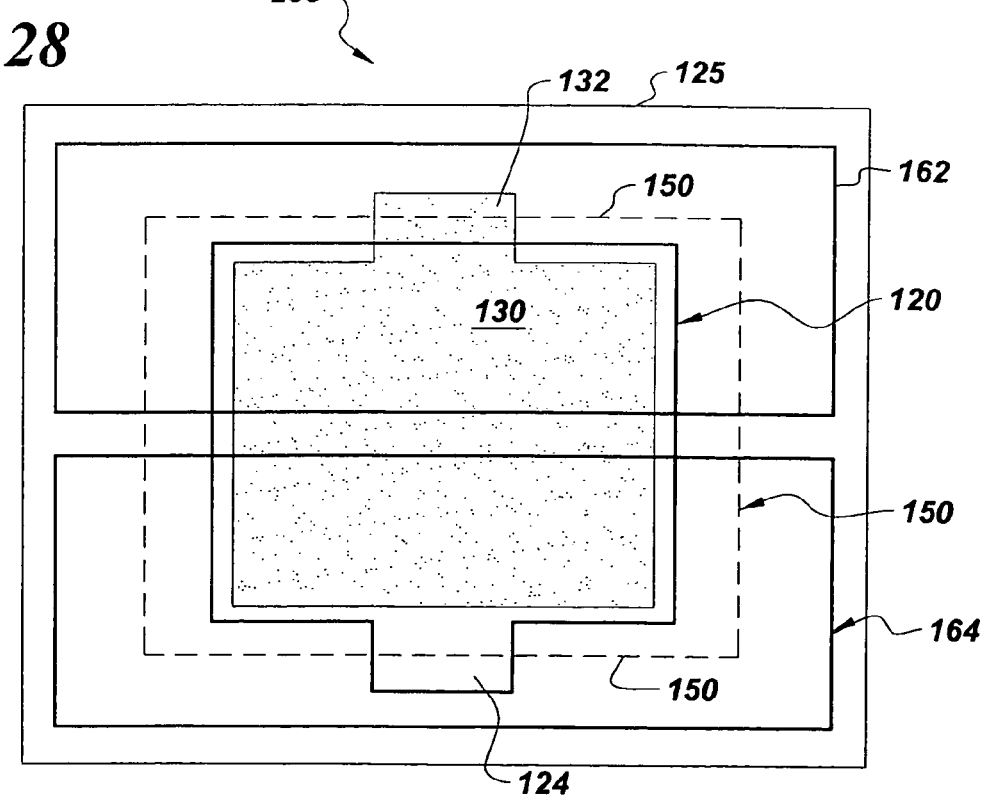
FIG. 28 is a bottom view of the OLED module of FIG. 27.

Referring to FIGS. 27 and 28, an OLED module 200 of the light emitting device is shown according to another embodiment of the invention. The OLED module 200 comprises the light emitting layer 110, the second electrode 130, and the first electrode 120 that is light transmissive. The OLED module 200 also includes a substrate 125 that is light transmissive. The elements in FIGS. 27 and 28 (e.g. the second electrode 130, first electrode 120, light emitting layer 110) corresponding to those in FIG. 22 are formed of the same materials as described above with respect to FIG. 22. Upon application of a voltage, light (represented by arrows 101) is generated in the light emitting layer 110 of FIG. 27 and propagates through the second electrode 130 and the substrate 125.

Adjacent to the first electrode 120 is a sealing member 150, typically comprising glass, which provides a barrier to oxygen and water. In one embodiment of the present invention, the sealing member 150, in conjunction with a sealant 152 comprises epoxy, a metal, or a glass frit, for example, provides a near hermetic barrier to prevent water and oxygen penetration into the first electrode 120, second electrode 130 and light emitting layer 110.

Formed adjacent to the sealing member 150 are first and second electrical contacts 162, 164, which provide electrical connections to the second electrode 130 and first electrode 120, respectively. As shown most clearly in FIG. 28, the first device electrical contact 162 connects electrically to the second electrode 130 in a tab region 132 of the second electrode 130. The tab region 132 is beyond the perimeter of the sealing member 150. The second electrical contact 164 connects electrically to the first electrode 120 in a second tab region 124 of the first electrode 120. The tab region 124 is beyond the perimeter of the sealing member 150. The light emitting layer 110 (not shown in FIG. 28) typically occupies at least the overlap region of the second electrode 130 and the first electrode 120 and in one embodiment of the present invention extends beyond these electrodes.

Referring again to FIG. 27, the electrical contacts 162, 164 typically have respective contacting surfaces 163, 165 which occupy a common plane. These device contacting surfaces 163, 165 facilitate the mounting of one or more OLED modules 200 onto the substrate 125, as will be described further below in connection with FIG. 27.

An advantageous feature of the electrical contacts 162, 164 is described with reference to an imaginary surface running through the light emitting layer 110. The imaginary surface, which is typically planar, divides the OLED module 200 into a first side and a second side. The second electrode 130 is disposed on the first side, and the first electrode 120 is disposed on the second side. The light is emitted through the first side, and the electrical contacts 162, 164 extend to the second side. For example, the first electrical contact 162 extends from the second electrode 130 on the first side to the second side of the OLED module 200. The second electrical contact 164 extends from the first electrode 120 on the second side to another location on the second side of the OLED module 200. Thus, the OLED module 200 is configured to be powered by contacting both electrical contacts 162, 164 on a common planar surface 163, 165 which is on an opposite side of the OLED module 200 from where the light emission occurs. Typically, the planar surface defined by surfaces 163, 165 is parallel to the light emitting layer 110 and the substrate 125. This configuration allows a number of OLED modules 200 to be easily mounted adjacent to each other ("tiled") on the substrate 125.

As shown in FIG. 28, the substrate 125 defines the area of the OLED module 200. The first and second electrical contacts 162, 164 occupy an area, which is within the area of the substrate 125. Therefore, two OLED devices are placed directly adjacent to each other without any electrical connectors in between and with a small separation distance between the adjacent light emitting device substrates 125. In one embodiment of the present invention, the separation distance less than 2 centimeters (cm). In another specific embodiment of the present invention, the separation distance is selected from the group comprising, 1 cm, 0.5 cm, 0.25 cm, and combinations thereof. In another specific embodiment of the present invention, the separation distance is greater than 0.1 cm.

D. The Photoluminescent Layer

As shown in FIG. 27, in another specific embodiment of the present invention, the OLED module 200 includes a photoluminescent layer 135. The photoluminescent layer 135 comprises a photoluminescent material, which absorbs light from the light emitting layer 110, and emits light typically having a longer wavelength. In another specific embodiment the photoluminescent, material comprises an inorganic phosphor. In another specific embodiment, the photoluminescent material comprises an organic photoluminescent material such as an organic dye. Examples of phosphor materials that are utilized include those phosphors based on cerium doped into an $Y_3Al_5O_{12}$ (YAG) lattice, which crystallizes in the garnet structure. Specific phosphor examples include $(Y_{1-x-y}Gd_xCe_y)_3Al_5O_{12}$ (YAG:Gd,Ce), $(Y_{1-x}Ce_x)_3Al_5O_{12}$ (YAG:Ce), $(Y_{1-x-y}Ce_x)_3(Al_{1-y}Ga_y)_5O_{12}$ (YAG:Ga,Ce) and $(Y_{1-x-y}Gd_xCe_y)_3(Al_{5-z}Ga_z)_5O_{12}$ (YAG:Gd,Ga,Ce) and $(Gd_{1-x}Ce_x)Sc_2Al_3O_{12}$ (GSAG). The YAG phosphors are generally described as $(Y_{1-x-y}Gd_xCe_y)_3(Al_{1-z}Ga_z)_5O_{12}$, wherein $x+y \leq 1$; $0 \leq x \leq 1$; $0 \leq y \leq 1$; and $0 \leq z \leq 1$. The position of the peak of the emission band varies considerably in the aforementioned phosphors. Depending on the garnet composition, the $Ce^{3+}$ emission is tuned from the green (~540 nm; YAG:Ga,Ce) to the red (~600 nm; YAG:Gd:Ce) without appreciable loss in the luminescence efficiency.

An appropriate phosphor material or blend of phosphor materials in combination with an light emitting layer, such as a blue or a UV light emitting light emitting layer, produces a white field corresponding to a wide range of color temperatures. In another specific embodiment of the present invention, light sources in the form of large area white light electroluminescent panels (i.e., having a size of greater than 1 square meter), which closely approximate the color, CRI, and brightness of conventional fluorescent lamps are made with such phosphors and organic light emitting devices.

In one specific embodiment of the present invention, an organic blue light emitting polymer layer 110 is poly(9,9-di-n-hexylfluorene-2,7-diyl) and the phosphor material is (YAG: Ce), which absorbs the blue light and emits yellow light, the combination of which appears white to a human observer. In another specific embodiment of the present invention, the second electrode material is ITO and the first electrode material is the LiF/Al bilayer. The relative weighting of the components is chosen such that the white light is on the blackbody locus (as desired for illumination applications) with a color temperature of 6050K. The expected color rendition index (CRI) is calculated to be >70, preferably 74. The color temperature is adjusted to vary between 3500K and 6500K on the black body locus by varying the phosphor thickness and composition. This OLED module 200 has an energy efficiency (radiant watts out per electrical watt in) of 1.2%. In one embodiment of the present invention, the efficiency of the OLED module 200 is improved by adding an output coupler.

In another specific embodiment of the present invention, more than one phosphor material is combined together and then utilized with the light emitting layer 110 to achieve different colors (i.e., white or other colors), color temperatures, and color rendition indices. Other phosphors which are used are described in U.S. application Ser. No. 09/469,702, entitled "Luminescent Display and Method of Making", filed Dec. 22, 1999, in the name of Anil Duggal and Alok Srivastava, which is hereby incorporated by reference. An example of a suitable red emitting inorganic phosphor is $SrB_4O_7$: $Sm^{2+}$, where the $Sm^{2+}$ following the colon represents an activator. This phosphor absorbs most visible wavelengths shorter than 600 nm and emits light as a deep red line with a wavelength greater than 650 nm. An example of a suitable green emitting inorganic phosphor is $SrGa_2S_4$:Eu $^{2+}$. This phosphor absorbs below 500 nm and has a maximum emission at 535 nanometers. An example of a suitable blue emitting inorganic phosphor is $BaMg_2Al_{16}O_{27}$:Eu $^{2+}$. $BaMg_2Al_{16}O_{27}$:$Eu^{2+}$ absorbs most wavelengths below 430 nm and has a maximum emission at 450 nm. Examples of organic dyes that are typically utilized in the photoluminescent layer include coumarin 460 (blue), coumarin 6 (green), and Nile red.

An alternative way of generating white light from the light emitting device without using the phosphor or the dye in the photoluminescent layer 135 is to utilize a full color display with separately addressable color pixels and tune the colors to emit white light. This approach allows color tunability but potentially increases complexity and cost. Furthermore, instead of using separately addressable color pixels, a blend of various dye molecules and/or polymers that emit different colors is placed into the active region of the OLED module 200 to achieve white light. This approach has the advantage of simple, low cost, fabrication. However, different organic components in the device age differently, which leads to a color shift with time. In contrast, the use of the phosphor in the photoluminescent layer 135 is advantageous because the device does not suffer from color shifts due to differential aging of different organic molecular and polymer components.

In one embodiment of the present invention, a separate photoluminescent layer 135 is present over the substrate 125, and an output coupler 145 is formed over the luminescent material 135, as illustrated in FIG. 27. Thus, the output coupler 145 is used as a sealing layer to preserve the luminescent material 135, especially if the output coupler 145 comprises a glass material. The index of refraction of the output coupler 145 is preferably matched to that of the luminescent layer 135.

In another embodiment of the present invention, the OLED module 200 also includes an optional scattering layer comprising scattering particles such as $TiO_2$ or $SiO_2$ for effective color mixing and brightness uniformity.

II. Method of Making the OLED Module and Light Emitting Device

Figure 29:
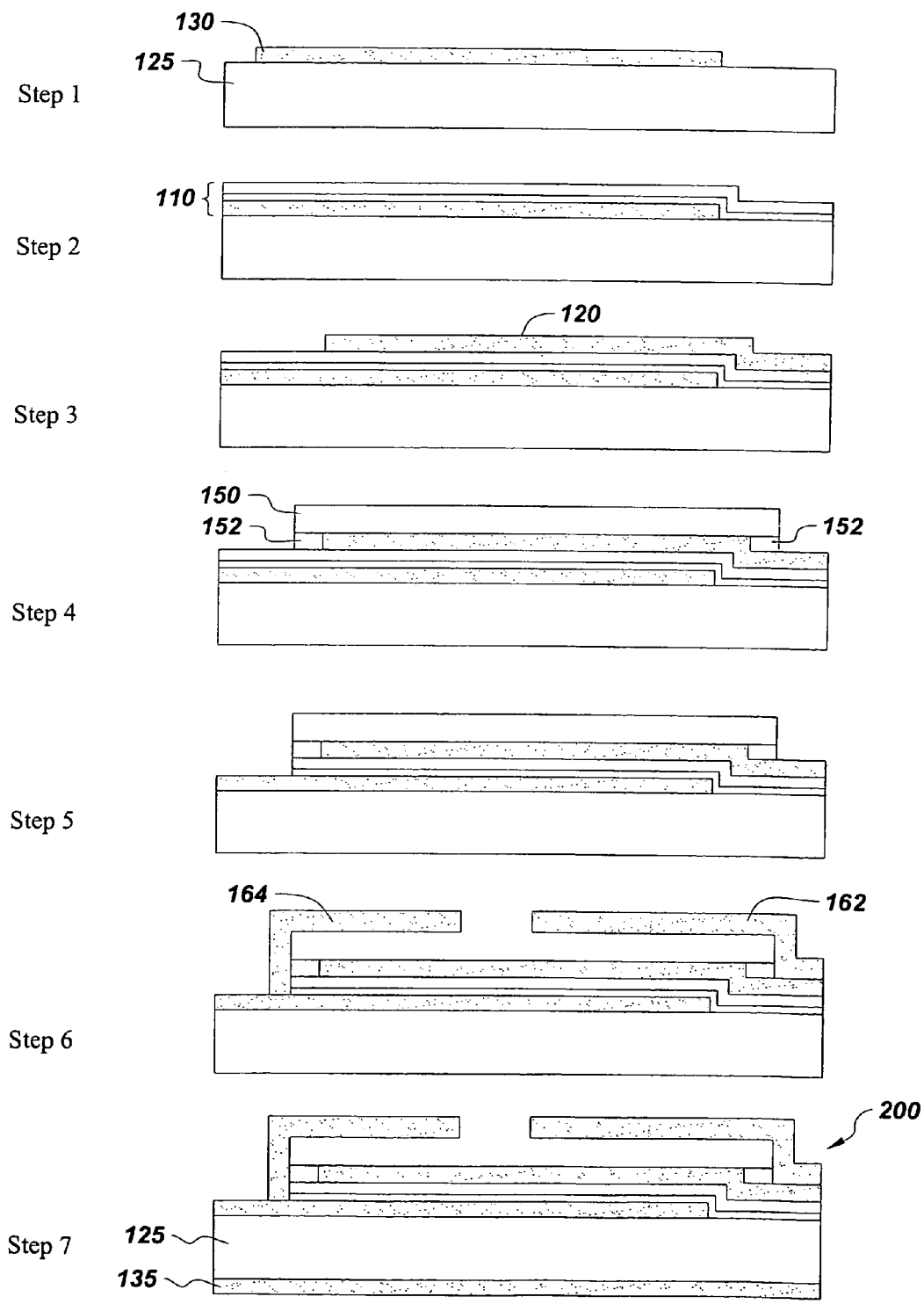
FIG. 29 illustrates a method of making the OLED module of FIG. 27 according to another embodiment of the present invention.

FIG. 29 illustrates a method for forming the OLED module 200 of FIGS. 27 and 28 according to an exemplary embodiment of the invention. As shown in FIG. 29, step 1, the substrate 125 is sputter coated with a layer of thin indium tin oxide (ITO), which is then patterned to form the second electrode 130, e.g. in the pattern shown in FIG. 28. In step 2, the light emitting layer 110 (which, in various embodiments discussed above, includes one or more sublayers as shown in FIGS. 22-26) is deposited, for example by spin coating or inkjet processing. In step 3 of FIG. 29, the first electrode 120 is deposited as a reflective structure comprising a thin layer of lithium fluoride overcoated with aluminum, for example. In one embodiment of the present invention, the first electrode 120 is deposited through a stencil mask by evaporation. The sealing member 150 is next applied with a sealant 152 in step 4 to form a near hermetic barrier. In one embodiment of the present invention, the sealing member 150 comprises glass.

In step 5, the light emitting layer 110 extending beyond the sealing member 150 is removed by solvent or dry etching methods. The device electrical contacts 162, 164 are then applied to the reflective side of the organic light emitting device 200 in step 6. In one embodiment of the present invention, the device electrical contacts 162, 164 comprise a metal such as aluminum, silver, and combinations thereof. The electrical contacts 162, 164 allow for external contact to the organic light emitting device and additionally provides a near hermetic seal to the second electrode 130, first electrode 120, and light emitting layer 110. In step 7, optionally, the luminescent layer 135, as described above with respect to FIGS. 27 and 28, is applied to the device substrate 125. Optionally, a layer of scattering particles is applied in a subsequent step. The steps shown in FIG. 29 are of course merely an example of a method of making an OLED module 200, and not intended to be limiting.

In one embodiment of the present invention, after the OLED module 200 is completed, the output coupler 145 is attached to the substrate 125. In another embodiment of the present invention, where the luminescent layer 135 is disposed over the substrate 125, the output coupler 145 is formed over the luminescent layer 135.

Figure 30:
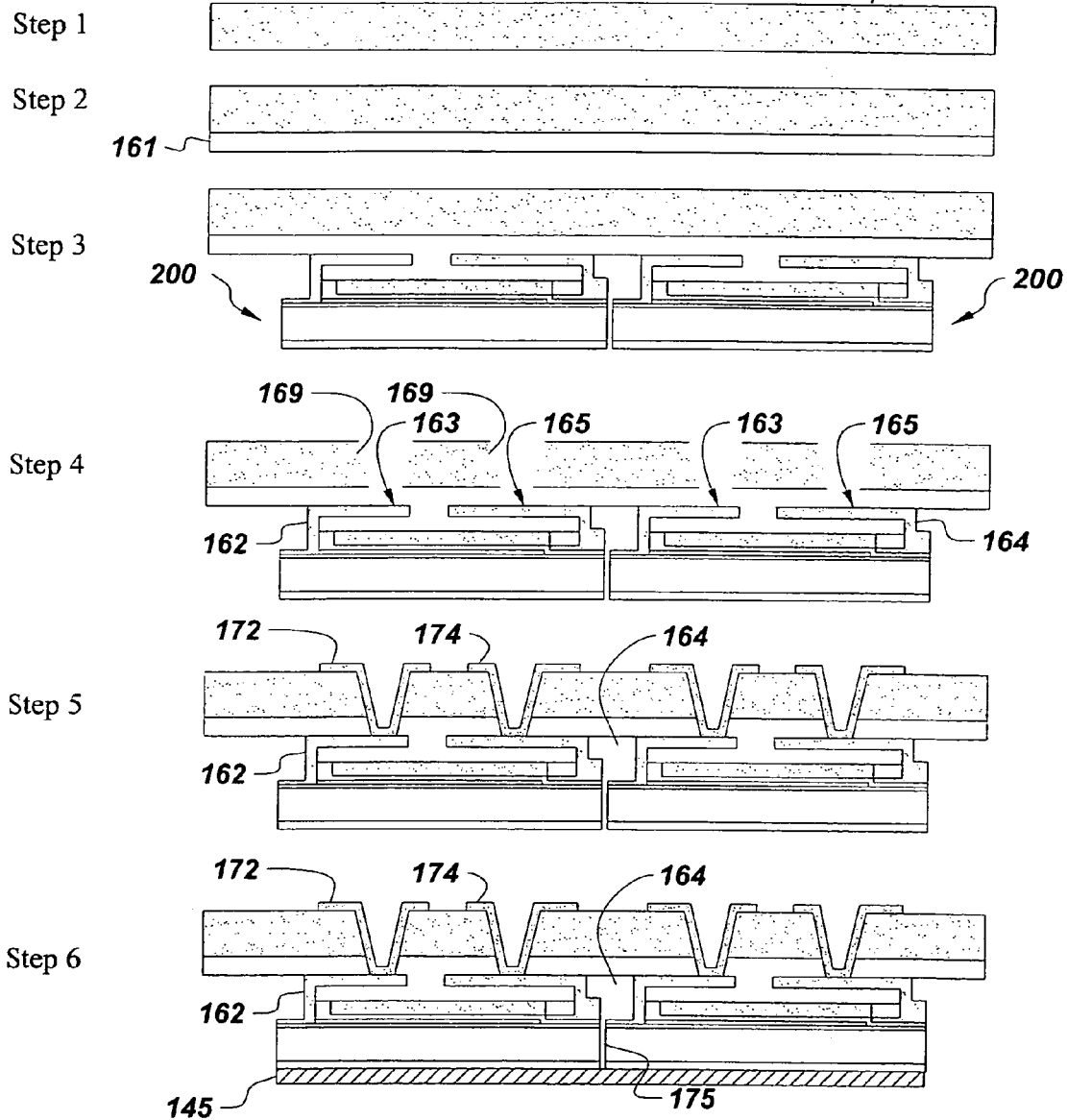
FIG. 30 illustrates a method of mounting a plurality of OLED modules on a mounting substrate to produce a light emitting device according to another embodiment of the invention.

FIG. 23 illustrates a method of mounting one or more OLED modules 200 onto a mounting substrate 160 to form the light emitting device 10 of FIG. 1 according to another embodiment of the invention. Step 1 of FIG. 30 shows the substrate 160. In one embodiment of the present invention, the substrate 160 is selected from the group consisting of a conventional printed circuit board such as FR4 or GETEK, a flexible polymer film such as Kapton E™ and Kapton H™ polyimide (Kapton is a trademark of E. I. Du Pont de Nemours & Co.), a Apical AV polyimide (Apical is a trademark of Kanegafugi Chemical Company), a Upilex polyimide (Upilex is a trademark of UBE Industries, Ltd), and any combination thereof. In one specific method embodiment, freestanding Kapton™ polyimide is mounted on a rigid frame (not shown in FIG. 30), which rigidly supports the flexible film during processing and for end use if desired. An adhesive, typically comprising a material capable of adhering at a low temperature, is applied to the rigid frame. Examples of suitable adhesives include materials such as ULTEM polyetherimide (ULTEM™ is a trademark of General Electric Company) and MULTIPOSIT™ XP-9500 thermoset epoxy (MULTIPOSIT is a trademark of Shipley Company Inc., Marlborough, Mass.).

In step 2, according to one embodiment, another adhesive 161 is applied to the substrate 160, as shown in FIG. 30. In one embodiment of the present invention, the adhesive 161 is an organic adhesive. In one specific embodiment of the present invention, the adhesive 161 is selected from the group consisting of ULTEM™, SPIE (siloxane polyimide epoxy), polyimide and epoxy blends, cyanoacrylate, and combinations thereof.

In step 3, one or more OLED modules 200 are placed on the adhesive 161, and the adhesive is cured to bond the OLED modules 200 to the mounting substrate 160.

Figure 31:
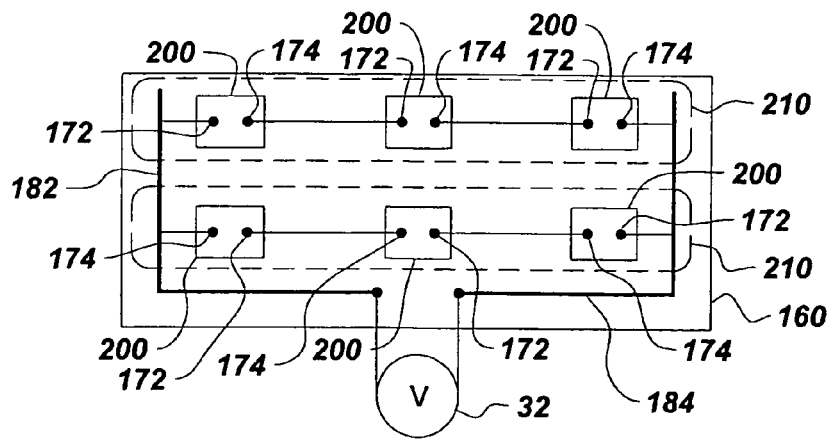
FIG. 31 is a diagram of electrical connections to a plurality of OLED modules of a light emitting device according to another embodiment of the invention.
Figure 32:
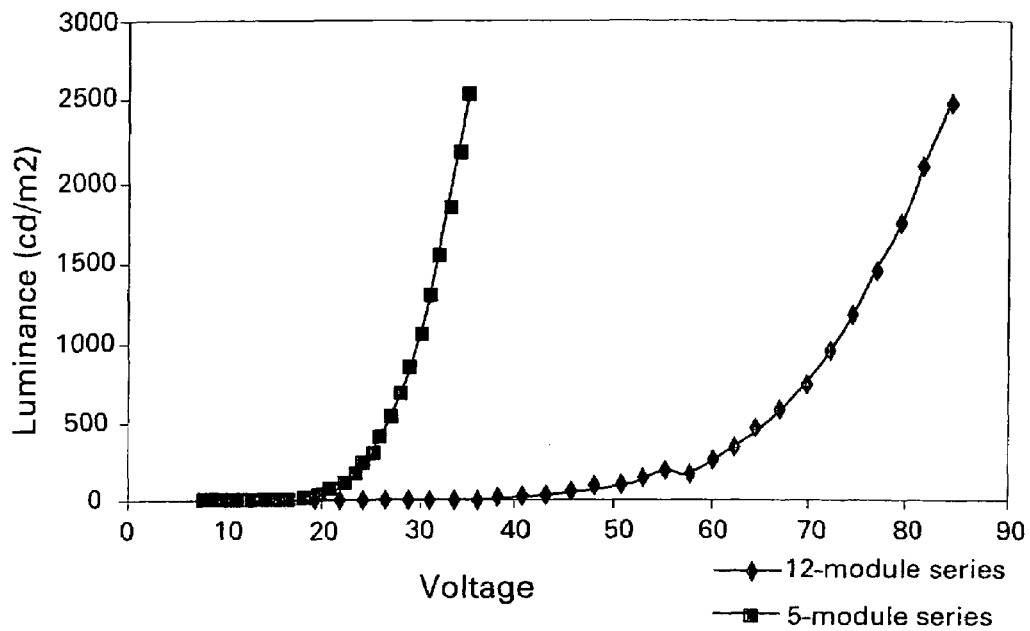
FIG. 32 is a graph of luminance in candela per square meter ($cd/m^2$) versus applied voltage of individual OLED modules, the 12 module series and the 5 module series.
Figure 33:
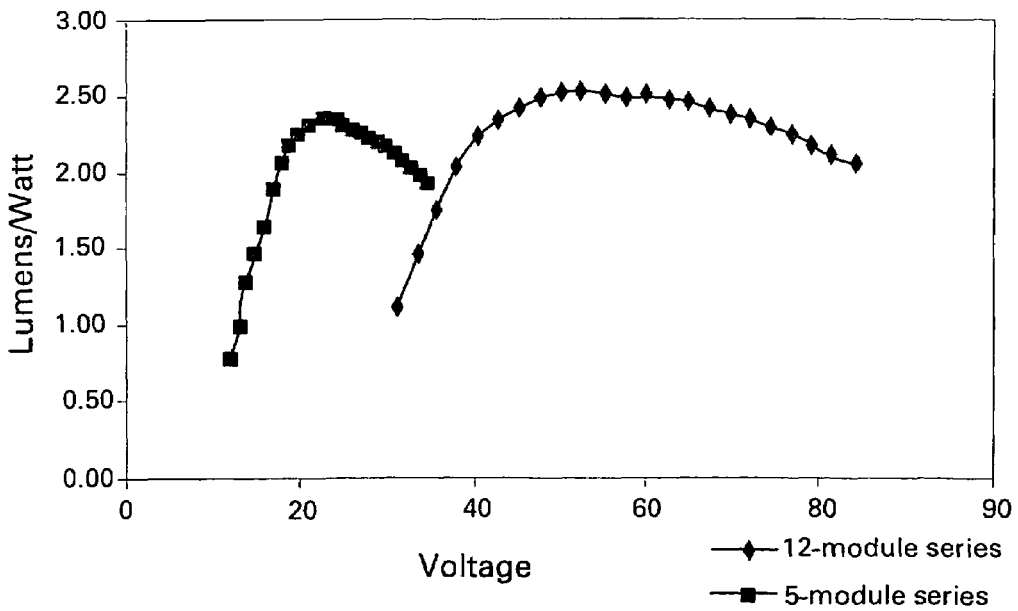
FIG. 33 is a graph of the lumens per watt versus applied voltage of individual OLED modules, the 12 module series and the 5 module series.
Figure 34:
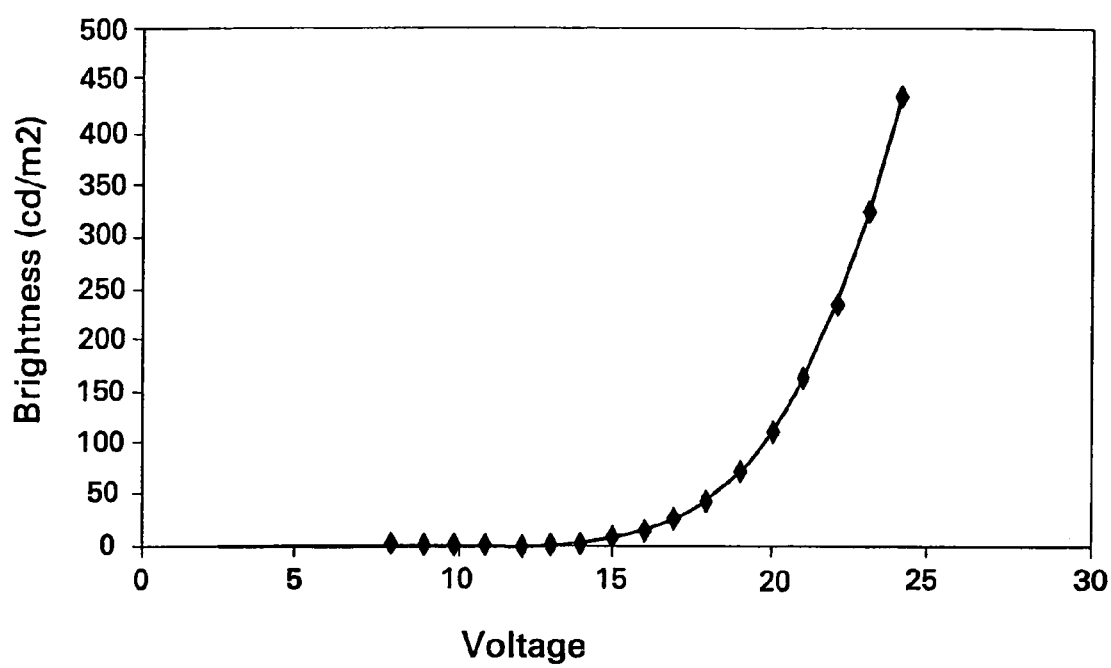
FIG. 34 is a graph of brightness versus applied voltage of a light emitting device of the present invention.

In one embodiment of the present invention, the individual OLED modules 200 are tiled to depict at least any one of the group consisting of letters, numerals, images, and combinations thereof. FIG. 3 depicts an embodiment where the OLED modules 38 of FIG. 31 are arranged to depict letters. FIG. 4 depicts an embodiment where each OLED module 38 is its own letter.

In step 4 of FIG. 30, vias 169 are formed using laser ablation or reactive ion etching, for example, through the mounting substrate 160 and the adhesive 161 to the device contacting surfaces 163, 165 of the electrical contacts 162, 164, respectively. In step 5, first and second mounting electrical contacts 172, 174 are formed or inserted into the via holes 169 to make contact with the electrical contacts 162, 164, respectively.

In one embodiment of the present invention, the mounting electrical contacts 172, 174 are formed as a patterned metal layer. In a more specific embodiment of the present invention, the patterned metal layer is formed by the processes of the group consisting of sputtering, electroless plating techniques, sputtering in combination with electroplating, electroless plating techniques in combination with electroplating, and any combination thereof. In one embodiment of the present invention, the patterned metal layer is patterned with a photoresist and etch process. The interconnect metallization in one embodiment comprises a thin adhesion layer of 1000 angstroms (Å) sputtered titanium, coated by a thin layer of 3000 Å sputtered copper, coated by a layer of electroplated copper to a thickness of 4 microns, for example. In a more specific embodiment of the present invention, a buffer layer of 1000 Å of titanium is applied over the electroplated copper. In a more specific embodiment of the present invention, the mounting electrical contacts 172, 174 are applied by evaporation with a shadow mask. In another more specific embodiment of the present invention, the mounting electrical contacts 172, 174 are applied by screen printing.

In one embodiment of the present invention, step 6 applies the output coupler 145 to OLED modules 200 to at least one of the OLED modules 200, as shown in FIG. 307. In another embodiment of the present invention, step 6 applies a scattering layer to at least one of the OLED modules 200 (not shown in FIG. 30). In another more specific embodiment of the present invention, a nonconductive material such as SPIE (siloxane polyimide epoxy) is inserted into the gaps 175 between adjacent OLED modules 200. Although only two OLED modules 200 are shown in FIG. 30 for the sake of simplicity of illustration, this method is useful in constructing large area light sources comprising many individual OLED modules 200.

Some embodiments of the present invention dispose the OLED modules 200 very close to each other on the substrate 160. In another embodiment of the present invention, a wider spacing between individual OLED modules 200 is established. In one embodiment of the present invention, the scattering layer was disposed to not bridge the adjacent OLED modules 200.

Spacing between OLED modules 200 also occurs in the case where the mounting substrate 160 is designed to be flexible, curved, or non-planar. The mounting substrate 160 is formed in any desired shape, e.g. to conform to an existing building structure. In one embodiment of the present invention, the OLED modules 200 are sized such that they collectively follow the shape of the substrate 160. Thus, the combination of a flexible, curved, or non-planar substrate 160 and appropriately sized OLED modules 200 produces a light source having an emitting surface in many desired shapes, e.g. cylindrical, spherical, etc. In one embodiment of the present invention, the spacing of the OLED modules 200 on the mounting substrate 160 is designed such that the substrate 160 forms a right angle between adjacent OLED modules 200. In this case, the emitting surfaces of adjacent OLED modules 200 together forms a corner with perpendicular emitting surfaces.

After the first mounting electrical contact 172 and the second mounting electrical contact 174 are installed, they are connected to a suitable AC power supply 32 of FIG. 31. FIG. 31 also illustrates an example of a connection layout for six OLED modules 200 arranged into two series groups 210 of three modules 200 each. The OLED modules 200 of each of the two series groups 210 are electrically connected in a series arrangement. For one of the series groups 210, the first conducting layer or line 182 is electrically connected to the first mounting electrical contact 172 of the first OLED module 200. The second mounting electrical contact 174 of the first OLED module 200 is connected to a first mounting electrical contact 172 of the middle OLED module 200, and the second mounting electrical contact 174 of the middle OLED module 200 is connected to a first mounting electrical contact 172 of the last OLED module 200 as shown in FIG. 31. The second line 184 connects to the second mounting electrical contact 174 of the last OLED module 200 to complete the series connections. In one embodiment of the present invention, the other of the two series groups 210 is connected with opposite polarity. In one embodiment of the present invention, upon application of an AC voltage, the plurality of OLED modules 200 of one series group 210 are activated for one half cycle, and then the OLED modules 200 of the other series group 210 are activated for the next half cycle. In one embodiment of the present invention, the connecting structure, e.g. as shown in FIG. 31, utilizes highly conductive materials such as copper to efficiently carry power to the individual OLED modules 200.

EXAMPLES

A light emitting device including OLED modules according to the present invention was fabricated. The light emitting device consisted of two series groups each of which consisted of two OLED modules. Each OLED module 200 consisted of a green-emitting OLED device made in the following manner. Indium tin oxide (ITO) coated glass (15 ohm-square) was obtained from Applied Films Corporation, and portions of it were etched away using vapors of aqua regia to provide an ITO pattern. This substrate was then mechanically cleaned with a detergent, soaked in a methanol solution followed by a boiling isopropyl alcohol solution, and finally placed in an ozone cleaner for 15 minutes. An approximately 30 nm layer of poly(3,4)ethylenedioxythiophene/polystyrenesulphonate (PEDT/PSS) from Bayer Corporation was then spin coated onto the ITO. Approximately 70 nm of a green-emitting polymer (Green-B purchased from Dow Chemical Co.) was then spin coated onto the PEDT/PSS layer using xylene as the solvent. Next, a cathode consisting of an approximately 0.8 nm layer of lithium fluoride followed by about 200 nm of aluminum was evaporated onto the device through a shadowmask to define the cathode pattern. The cathode deposition was carried out in a glove box. After deposition of the cathode, a glass slide was attached to the cathode device with epoxy in order to provide encapsulation. The resulting device consists of two independently addressable OLEDs, which emit green light in a rectangular pattern.

Each OLED module 200 consisted of two individual OLED devices of which only one was utilized. The current versus voltage and brightness versus voltage for each of the devices utilized were first measured under direct current (DC) conditions. The resulting data curves are shown in FIGS. 23 and 24 of copending U.S. application Ser. No. 10/889,498 (a Divisional Application of the present application), filed on Jul. 10, 2004, FIGS. 23 and 24 of which are incorporated herein by reference. The curves were not identical for each device due to uncontrolled variations in processing conditions and sample history.

The four OLED modules were then taped to a cardboard substrate in two rows, each row having two modules. These two rows defined the series groups of the device. Within each row, the cathode of one module was connected to the anode of the other module. The free anode and cathode of each row were then connected with opposite polarity to the output of a variable transformer. The input to the transformer was the standard 110V AC line voltage. When the output of the transformer was set to approximately 8V rms, all four modules provided light with a brightness of roughly 300 Cd/m$^2$. (The actual measured brightnesses were 390 and 400 for the modules in the first row (group) and 280 and 300 Cd/m$^2$ for the modules in the second row (group).) In addition, there was no perceivable modulation to the human observer in light output due to the non-DC power input. The current and voltage waveforms during operation were measured and are shown in FIG. 25 of copending U.S. application Ser. No. 10/889,498 (a Divisional Application of the present application), filed on Jul. 10, 2004, FIG. 25 of which is incorporated herein by reference. One can see that current flows during both half-cycles of the AC power because the two series groups are connected with opposite polarity. This is clarified in FIG. 26 of copending U.S. application Ser. No. 10/889,498, filed on Jul. 10, 2004 (a Divisional Application of the present application), FIG. 26 of which is incorporated herein by reference, where the current traveling through each group is separately measured. One can see that each group exhibits significant current during only one of the two half-cycles.

Although the invention has been described and illustrated in detail, it is to be clearly understood that the same is intended by way of illustration and example only and is not to be taken by way of limitation. Obviously many modifications and variations of the present invention are possible in light of the above teaching. Accordingly, the spirit and scope of the present invention are to be limited only by the terms of the appended claims.

What is claimed is:

1. A light emitting device, comprising:
 a substrate; and
 at least one organic light emitting diode (OLED) series group disposed on the substrate, said OLED series group comprising at least a first and a second OLED module, said OLED modules being electrically connected in series;
 wherein each OLED module further comprises a respective first electrode, second electrode, and light emitting layer, said first electrode being disposed on said substrate, and said light emitting layer being disposed such that a portion of said layer is between said first and second electrodes and configured to emit light upon application of a voltage between said respective first and second electrodes;
 at least one of said OLED modules further comprising an electrically-conductive interconnect segment disposed so as to be electrically coupled to the first electrode of said first OLED module; said interconnect segment further being disposed over a portion of said substrate disposed between said first OLED module and said second OLED module and further disposed to be electrically coupled to the second electrode of said second module.

2. The light emitting device of claim 1 further comprising:
 at least one first conducting line provided on the substrate, the at least one first conducting line electrically connected to a first end of said at least one OLED series group; and
 a second conducting line provided on the substrate, the second conducting line electrically connected to a second end of said at least one OLED series group opposite the first end.

3. The light emitting device of claim 2, further comprising:
 a converting circuit that converts an applied AC voltage with a sinusoidal waveform to a converted voltage waveform, and applies the converted voltage waveform to the at least one first and the second conducting lines.

4. The light emitting device of claim 3, wherein the converting circuit comprises back-to-back zener diodes, and the converted voltage waveform is a clipped sine wave.

5. The light emitting device of claim 3, wherein the converted voltage waveform has a first time period during which the voltage is positive and a second time period during which the voltage is negative, and the first time period is approximately equal to the second time period.

6. The light emitting device of claim 3, wherein the converting circuit comprises an oscillator that provides a driving frequency of the converted voltage waveform, where the driving frequency is different than a frequency of the sinusoidal waveform.

7. The light emitting device of claim 3, wherein the converting circuit comprises an oscillator that provides a driving frequency of the converted voltage waveform, where the driving frequency is different than a frequency of the sinusoidal waveform, and wherein the converted voltage waveform is a square pulse waveform.

8. The light emitting device of claim 3, wherein the converting circuit comprises an oscillator that provides a driving frequency of the converted voltage waveform, where the driving frequency is different than a frequency of the sinusoidal waveform, and wherein the converted voltage waveform has a frequency greater than about 10 kHz.

9. The light emitting device of claim 2, further comprising:
 an alternating current (AC) power source, electrically connected to and providing an AC voltage to the first and second conducting lines.

10. The light emitting device of claim 9, wherein the AC power source provides a voltage with a sinusoidal waveform.

11. The light emitting device of claim 2, wherein each OLED module comprises a respective anode and cathode, the OLED modules of said at least one OLED series group serially connected anode to cathode.

12. The light emitting device of claim 1, wherein said respective second electrode comprises a transparent electrode.

13. The light emitting device of claim 12, wherein the second electrode comprises indium tin oxide.

14. The light emitting device of claim 1, wherein the interconnect and the first electrode comprise the same material.

15. The light emitting device of claim 1, wherein the first electrode and the interconnect form a unitary undivided structure.

16. The light emitting device of claim 1, wherein the OLED modules are configured to emit light upon application of an AC voltage.

17. The light emitting device of claim 1, comprising a plurality of OLED series groups.

18. The light emitting device of claim 17, wherein said OLED series groups are disposed in a spatial relationship with another to represent a predetermined shape when illuminated.

19. The light emitting device of claim 18, wherein the series groups are arranged such that the first ends of the series groups have opposite polarity with respect to each other.

20. The light emitting device of claim 17, wherein the plurality of OLED series groups is arranged as part of a sign.

21. The light emitting device of claim 17, wherein the series groups are arranged such that the first ends of the series groups have opposite polarity with respect to each other.

22. The light emitting device of claim 17, further comprising a plurality of circuit elements, each circuit element electrically connected in parallel with a respective OLED module;
   wherein each OLED module comprises a respective anode and cathode, the OLED modules of each OLED series group serially connected anode to cathode.

23. The light emitting device of claim 17, further comprising a plurality of circuit elements, each circuit element electrically connected in parallel with a respective more than one OLED module;
   wherein each OLED module comprises a respective anode and cathode, the OLED modules of each OLED series group serially connected anode to cathode.

24. The light emitting device of claim 17, further comprising a plurality of circuit elements, each circuit element electrically connected in series with a respective OLED module;
   wherein each OLED module comprises a respective anode and cathode, the OLED modules of each OLED series group serially connected anode to cathode.

25. The light emitting device of claim 17, further comprising a plurality of circuit elements selected from the group consisting of a resistor, a diode, a varistor, and combinations thereof.

26. The light emitting device of claim 17, further comprising a plurality of circuit elements, wherein each of the circuit element provides for fault tolerance of a respective OLED module.

27. A light emitting device, comprising:
   a substrate;
   a plurality of organic light emitting diode (OLED) series groups provided on the substrate, each OLED series group comprising a plurality of OLED modules, the OLED modules of each OLED series group electrically connected in series, wherein the OLED modules are configured to emit light upon application of an AC voltage;
   at least one first conducting line provided on the substrate, the at least one first conducting line electrically connected to a first end of each OLED series group;
   a second conducting line provided on the substrate, the second conducting line electrically connected to a second end of each OLED series group opposite the first end; and
   a plurality of circuit elements, each circuit element electrically connected in parallel with a respective OLED module;
   wherein each OLED module comprises a respective anode and cathode, the OLED modules of each OLED series group serially connected anode to cathode.

28. The light emitting device of claim 27, wherein each of the circuit elements is selected from the group consisting of a resistor, a diode, a varistor, and combinations thereof.

29. The light emitting device of claim 27, wherein each of the circuit elements provides for fault tolerance of a respective OLED module.

30. A light emitting device, comprising:
   a substrate;
   a plurality of organic light emitting diode (OLED) series groups provided on the substrate, each OLED series group comprising a plurality of OLED modules, the OLED modules of each OLED series group electrically connected in series, wherein the OLED modules are configured to emit light upon application of an AC voltage;
   at least one first conducting line provided on the substrate, the at least one first conducting line electrically connected to a first end of each OLED series group;
   a second conducting line provided on the substrate, the second conducting line electrically connected to a second end of each OLED series group opposite the first end; and
   a plurality of circuit elements, each circuit element electrically connected in parallel with a respective more than one OLED module;
   wherein each OLED module comprises a respective anode and cathode, the OLED modules of each OLED series group serially connected anode to cathode.

31. A light emitting device, comprising:
   a substrate;
   a plurality of organic light emitting diode (OLED) series groups provided on the substrate, each OLED series group comprising a plurality of OLED modules, the OLED modules of each OLED series group electrically connected in series, wherein the OLED modules are configured to emit light upon application of an AC voltage;
   at least one first conducting line provided on the substrate, the at least one first conducting line electrically connected to a first end of each OLED series group;
   a second conducting line provided on the substrate, the second conducting line electrically connected to a second end of each OLED series group opposite the first end; and
   a plurality of circuit elements, each circuit element electrically connected in series with a respective OLED module;
   wherein each OLED module comprises a respective anode and cathode, the OLED modules of each OLED series group serially connected anode to cathode.

32. The light emitting device of claim 31, wherein each of the circuit elements modifies the voltage across a respective OLED module.

33. A light emitting device, comprising:
a substrate;
a plurality of organic light emitting diode (OLED) series groups provided on the substrate, each OLED series group comprising a plurality of OLED modules, the OLED modules of each OLED series group electrically connected in series, wherein the OLED modules are configured to emit light upon application of an AC voltage;
at least one first conducting line provided on the substrate, the at least one first conducting line electrically connected to a first end of each OLED series group;
a second conducting line provided on the substrate, the second conducting line electrically connected to a second end of each OLED series group opposite the first end; and
an alternating current (AC) power source, electrically connected to and providing an AC voltage to the first and second conducting lines;
wherein the AC power source provides a voltage with a square pulse waveform.

34. A light emitting device, comprising:
a substrate; and
a plurality of organic light emitting diode (OLED) series groups provided on the substrate, each OLED series group comprising a plurality of OLED modules, the OLED modules of each OLED series group electrically connected in series, wherein the OLED modules are configured to emit light upon application of an AC voltage, and wherein the plurality of OLED modules further comprises at least first and second OLED modules, each comprising a respective first electrode disposed on a respective portion of the substrate, wherein the second OLED module is disposed adjacent to the first OLED module, wherein the first OLED module comprises:
the first electrode being disposed on a first portion of the substrate,
a light emitting layer being disposed on a second portion of the substrate and a portion of the electrode of the first OLED module, and
a second electrode being disposed over a third portion of the substrate, being disposed on a portion of the light emitting layer, and being disposed on a portion of the first electrode of the second OLED module;
wherein the second OLED module is disposed adjacent to the first OLED module.

35. The light emitting device of claim 34, wherein the second electrode is disposed on the third portion of the substrate.

36. The light emitting device of claim 34, wherein the first portion of the substrate of the first OLED module is disposed adjacent to the second portion of the substrate; wherein the second portion of the substrate is disposed adjacent to the third portion of the substrate; wherein the third portion of the substrate is disposed adjacent to the first portion of the substrate of the second OLED module.

37. The light emitting device of claim 34, wherein the light emitting layer is comprised of multiple light emitting layers.

38. A light emitting device, comprising:
a substrate; and
a plurality of organic light emitting diode (OLED) series groups provided on the substrate, each OLED series group comprising a plurality of OLED modules, the OLED modules of each OLED series group electrically connected in series, wherein the OLED modules are configured to emit light upon application of an AC voltage;
wherein the plurality of OLED modules further comprises at least first and second OLED modules, each comprising a respective first electrode disposed on a respective portion of the substrate, wherein the second OLED module is disposed adjacent to the first OLED module, wherein the first OLED module comprises:
the first electrode of the first OLED module being disposed on a first portion of the substrate,
an interconnect being disposed on a portion of the first electrode of the first OLED module and a fourth portion of the substrate,
a light emitting layer being disposed on a second portion of the substrate, a portion of the first electrode, and a portion of the interconnect, and
a second electrode being disposed over a third portion of the substrate, being disposed on a portion of the light emitting layer, and being disposed on a portion of the first electrode of the second OLED module;
wherein the second OLED module is disposed adjacent to the first OLED module.

39. The light emitting device of claim 38, wherein the second electrode is disposed on the third portion of the substrate.

40. The light emitting device of claim 38, wherein the first portion of the substrate of the first OLED module is disposed adjacent to the second portion of the substrate; wherein the second portion of the substrate is disposed adjacent to the third portion of the substrate; wherein the third portion of the substrate is disposed adjacent to the fourth portion of the substrate; wherein the fourth portion of the substrate is disposed adjacent to the first portion of the substrate of the second OLED module.

41. The light emitting device of claim 38, wherein the light emitting layer is comprised of multiple light emitting layers.

* * * * *